(12) United States Patent
Meynants et al.

(10) Patent No.: US 9,041,579 B2
(45) Date of Patent: May 26, 2015

(54) ANALOG-TO-DIGITAL CONVERSION IN PIXEL ARRAYS

(71) Applicants: Guy Meynants, Retie (BE); Bram Wolfs, Nieuwrode (BE); Jan Bogaerts, St. Katelijne Waver (BE)

(72) Inventors: Guy Meynants, Retie (BE); Bram Wolfs, Nieuwrode (BE); Jan Bogaerts, St. Katelijne Waver (BE)

(73) Assignee: CMOSIS BVBA, Antwerp (BE)

( * ) Notice: Subject to any disclaimer, the term of this patent is extended or adjusted under 35 U.S.C. 154(b) by 0 days.

(21) Appl. No.: 14/158,818

(22) Filed: Jan. 18, 2014

(65) Prior Publication Data
US 2014/0203956 A1 Jul. 24, 2014

(30) Foreign Application Priority Data
Jan. 21, 2013 (GB) .................................. 1300999.8

(51) Int. Cl.
| H03M 1/12 | (2006.01) |
| H03M 1/34 | (2006.01) |
| H04N 5/378 | (2011.01) |
| H03M 1/56 | (2006.01) |

(52) U.S. Cl.
CPC ................. *H03M 1/34* (2013.01); *H04N 5/378* (2013.01); *H03M 1/56* (2013.01); *H03M 1/123* (2013.01)

(58) Field of Classification Search
CPC ....... H03M 1/0607; H03M 1/66; H03M 1/00; H03M 2201/02; H03M 2201/3115; H03M 2201/3131; H03M 2201/3157; H03M 2201/3168; H03M 2201/4135; H03M 2201/4225; H03M 2201/4233; H03M 2201/4262

USPC .......... 341/129, 128, 155, 164, 165, 169, 168
See application file for complete search history.

(56) References Cited

U.S. PATENT DOCUMENTS

| 5,877,715 | A * | 3/1999 | Gowda et al. ................. 341/122 |
| 7,088,279 | B2 | 8/2006 | Muramatsu |
| 7,227,488 | B2 * | 6/2007 | Cho .............................. 341/155 |
| 7,321,329 | B2 | 1/2008 | Tooyama |
| 7,623,173 | B2 * | 11/2009 | Nitta et al. .................... 348/302 |
| 7,880,662 | B2 | 2/2011 | Bogaerts |
| 7,924,335 | B2 * | 4/2011 | Itakura et al. ................. 348/308 |
| 7,952,630 | B2 * | 5/2011 | Taura ............................. 348/294 |
| 7,995,123 | B2 * | 8/2011 | Lee et al. ...................... 348/294 |
| 8,040,269 | B2 | 10/2011 | Bogaerts |
| 8,115,845 | B2 * | 2/2012 | Koh et al. ..................... 348/303 |
| 8,174,594 | B2 * | 5/2012 | Koh .............................. 348/294 |

(Continued)

FOREIGN PATENT DOCUMENTS

| EP | 2197118 A1 | 6/2010 |
| EP | 2221975 A2 | 8/2010 |

*Primary Examiner* — Linh Nguyen
(74) *Attorney, Agent, or Firm* — Sulzer, Green & Taylor, PLLC

(57) ABSTRACT

An analog-to-digital converter for generating an output digital value equivalent to the difference between a first analog signal level (Vres) and a second analog signal level (Vsig) comprises at least one input for receiving the first analog signal level and the second analog signal level, an input for receiving a ramp signal and an input for receiving at least one clock signal. A set of N counters, where N≥2, are arranged to use N clock signals which are offset in phase from one another. A control stage is arranged to enable the N counters based on a comparison of the ramp signal with the first analog signal level (Vres) and the second analog signal level (Vsig). An output stage is arranged to output the digital value which is a function of values accumulated by the N counters during a period when they are enabled.

20 Claims, 24 Drawing Sheets

(56) References Cited

U.S. PATENT DOCUMENTS

| | | |
|---|---|---|
| 8,253,616 B2 | 8/2012 | Bogaerts |
| 8,253,617 B2 | 8/2012 | Bogaerts |
| 8,358,349 B2 * | 1/2013 | Nishi ................. 348/207.99 |
| 8,618,974 B2 * | 12/2013 | Itzhak et al. ................. 341/164 |
| 8,773,544 B2 * | 7/2014 | Koh et al. ................. 348/220.1 |
| 8,830,105 B2 * | 9/2014 | Baker ................. 341/155 |
| 2008/0224913 A1 * | 9/2008 | Suzuki et al. ................. 341/155 |
| 2008/0231491 A1 * | 9/2008 | Muramatsu et al. ......... 341/164 |
| 2010/0110252 A1 | 5/2010 | Shimomura |
| 2012/0242877 A1 | 9/2012 | Tanaka |

\* cited by examiner

ANALOG-TO-DIGITAL CONVERSION IN PIXEL ARRAYS

RELATED APPLICATIONS

This application claims the benefit of priority of the filing date of British Patent Application 1300999.8 filed Jan. 21, 2013, which is incorporated herein by reference.

TECHNICAL FIELD

This invention relates to an analog-to-digital converter, to an analog-to-digital conversion apparatus, a pixel array and to a method of analog-to-digital conversion which can be used for generating an output digital value equivalent to the difference between a first analog signal level and a second analog signal level, such as analog signal levels output from a pixel array.

BACKGROUND OF THE INVENTION

Image sensors comprise an array of unit elements, called pixels. The array of pixels is exposed to radiation during an exposure period and, subsequently, the signal value of each pixel is read from the array. The array can be a one dimensional array (linear sensor) or a two dimensional array (area array) with pixels arranged in rows and columns.

FIG. 1A shows the typical architecture of a CMOS image sensor and FIG. 1B shows a typical four transistor (4T) pixel which can be used for each of the pixels. Impinging photons are converted into charges in the pixel array 10 and are accumulated during an integration period, also known as an exposure period. Typically, these pixels are selected by row for readout of their signals. The pixel includes a photodiode PD, a transfer gate to transfer the charge in the photodiode to the floating diffusion FD, a reset transistor M1, a source follower M2 and a row selection transistor M3. The reset transistor M1 is used to reset the floating diffusion FD to a known state before transferring charge from the photodiode PD to the floating diffusion FD, as known in the art. The source follower M2 converts the charges stored at the floating diffusion FD into an electrical output voltage signal at the column bus. The useful signal outputs of a pixel are analog voltages representing: (i) the reset signal level $V_{reset}$ and (ii) the signal level $V_{sig}$ that is generated after charge transfer from the photodiode PD. A desired output signal, which represents the amount of photons impinged onto the pixel during the integration period, is the difference between the reset signal level $V_{reset}$ and the signal level $V_{sig}$. In the sensor of FIG. 1A, there is sample and hold circuitry 15 associated with each column of the array. During the process of reading the array, the sample and hold circuitry 15 for each column stores the two signal values ($V_{reset}$, $V_{sig}$) for a pixel in a selected row. The two signals ($V_{reset}$, $V_{sig}$), or the difference between these signals ($V_{reset}$-$V_{sig}$), is converted from an analog value to a digital value. In FIG. 1A the analog-to-digital conversion is performed by a single ADC 16 in the output stage of the array and this single ADC 16 is used, on a time-shared basis, by the column circuits. In turn, signal values are transferred from each of the column circuits to the ADC 16 and converted to digital form.

Various arrangements have been proposed where analog-to-digital conversion is performed, in parallel, in an output stage of each column of the array. FIG. 2 shows an arrangement with a single-slope ADC comprising a ramp generator 20 and a synchronous counter 17. Each column has two data latches 18 and a comparator 19. A ramp signal is applied to each of the columns circuits. The ramp signal is distributed to all columns. The counter 17 is incremented in synchronism with the ramp signal such that, at any point in time, the counter 17 provides a digital representation of the analog value of the ramp signal output by the ramp generator 20. The comparator 19 in each column compares the level of the input signal ($V_{reset}$ or $V_{sig}$) against the gradually changing ramp signal. When the ramp voltage reaches the value of the input signal voltage, the comparator 19 output changes state and latches the digital code of the counter into a first memory 18. Afterwards, the same process is repeated for the other of the signals ($V_{reset}$, $V_{sig}$) and the code is latched into a second memory 18. The difference in digital codes is then sent to the output of the sensor.

Refinements of this arrangement are described in U.S. Pat. No. 7,088,279, U.S. Pat. No. 7,321,329, EP application 2 048 786 A2. As shown in FIG. 3, the circuitry 30 associated with each column is provided with a single dedicated bi-directional counter 31. The counter performs a count in one direction during a first conversion cycle, and a count in the other direction during a second conversion cycle. Other refinements are described in U.S. Pat. No. 7,880,662, U.S. Pat. No. 8,253,617 and U.S. Pat. No. 8,253,616 and are depicted in FIG. 4. The circuitry 30 associated with each column is provided with a single dedicated uni-directional counter 32. An example of timing of FIG. 4 is shown in FIG. 5. In this case, two conversion cycles are used. The counter is activated during the first conversion cycle when the ramp signal reaches the reset level and counts until the end of the ramp cycle. During a second conversion cycle, the counter is activated between the start of the ramp signal and when the ramp signal reaches the signal level. The value held in the counter at the end of the second conversion cycle is proportional to the difference between the signal level and reset level. This architecture has some advantages compared to more conventional architectures. Column-to-column variations of clock skew and counter delay which cause A/D conversion error can be corrected for.

A further refinement of this architecture targeted to faster conversion speeds is described in U.S. Pat. No. 8,040,269. Two counters are used inside each column. The counters run at a high frequency which is locally generated inside the column and which can vary from column to column. To avoid conversion errors due to variations in frequency between the columns, two counters are used. Two differential values can be determined by use of both counters. A first differential value corresponds to the difference between the signal and reset level. A second differential value corresponds to the difference between two reference levels which are common for all columns. The ratio of the two differential values is representative for the difference between the signal and reset level, and is not affected by the variations in clock frequency.

SUMMARY OF THE INVENTION

The present invention seeks to provide an alternative device or way for performing analog-to-digital conversion.

An aspect of the invention provides an analog-to-digital converter for generating an output digital value equivalent to the difference between a first analog signal level and a second analog signal level comprising:

at least one input for receiving the first analog signal level and the second analog signal level;

an input for receiving a ramp signal;

an input for receiving at least one clock signal;

a set of N counters, where N≥2, wherein the N counters are arranged to use N clock signals which are offset in phase from one another;

a control stage which is arranged to enable the N counters based on a comparison of the ramp signal with the first analog signal level and the second analog signal level; and an output stage for outputting the digital value which is a function of values accumulated by the N counters during a period when they are enabled.

An advantage of an embodiment is that it is possible to provide an increase in the speed of conversion and/or an increase in the bit resolution of the analog-to-digital conversion. The clock speed for n bit conversion is reduced by the number of clock phases used. Or, viewed from the point of view of conversion resolution, for a given clock speed the conversion resolution is increased by a number of bits which is the 2-base logarithm of the number of total counters. The resolution increases with the base-2 logarithm (log 2) of the number of counters. For example, two counters offers an extra bit of resolution, four counters offers an extra two bits, eight counters offers an extra three bits of resolution, and so on. A single counter has a resolution which is approximately log 2 of the number of clock cycles during the ramp signal cycle. If no offset variations or noise between reset and signal levels are present, the resolution with a single counter is exactly log 2 of the number of clock cycles.

The control stage can enable all of the N counters at a time, or a sub-set of the N counters at a time.

Advantageously, the set of N counters is divided into a first sub-set of counters and a second sub-set of counters, and the control stage is arranged to enable the first sub-set of counters or the second sub-set of counters. This has an advantage that one of the sub-sets of counters is enabled at any time.

Advantageously, the control stage has a first output state and a second output state and the control stage is arranged to enable one of the sub-sets of counters when the control stage is in the first output state and to enable the other sub-set of counters when the control stage is in the second output state. This has an advantage that one of the sub-sets of counters is enabled at any time.

The control stage can serially (i.e. sequentially) compare the ramp signal with the first analog signal level and the second analog signal level, or the control stage can compare, in parallel, the ramp signal with the first analog signal level and the second analog signal level.

Advantageously, the control stage is arranged to enable one of the sub-sets of counters during a first portion of a cycle of the ramp signal and to enable the other sub-set of counters during a second portion of the cycle of the ramp signal, wherein the first and second portions of the cycle of the ramp signal are contiguous in time. This has an advantage that one of the sub-sets of counters is enabled during the first and second portions of the cycle of the ramp signal.

Advantageously, the set of N counters is divided into a sub-set of M counters and a sub-set of K counters, where N=M+K.

Advantageously, N is an even integer value and wherein M=K. This can provide an advantage of a constant power consumption, as the same number of counters is in operation when each of the sub-sets is enabled.

An advantage of at least one embodiment is that the circuitry has a constant power consumption during the entire conversion process. During the entire conversion cycle one of the sub-sets of counters is counting and consuming current, while the other sub-sets of counters is idle. The power consumption does not depend on the analog signal level which is being converted. This contrasts with single counter, single clock, converters where the counter is counting only during a part of the conversion cycle. This part depends on the signal level. It can be that the counter is counting during nearly the entire conversion cycle for white pixels and only during short time for dark pixels. The change in power consumption can cause resistive current drops on the supply or in the ground lines, which may affect other sensitive analog circuitry which is present in the chip, such as sample-and-hold amplifiers. Such interferences can cause then for example banding effects in the image: if a row of the image is converted with a large number of white pixels, the few black pixels on that row may get a higher or lower value than when all pixels are black. This is visible in the image as a horizontal whiter or darker band in the black area next to a white area in an image.

The analog-to-digital converter can generate an output digital value equivalent to the difference between a first analog signal level and a second analog signal level using a ramp signal. Alternatively, the analog-to-digital converter can generate an output digital value equivalent to the difference between a first analog signal level and a second analog signal level over two cycles of the ramp signal. The control stage is operable, during a first cycle of the ramp signal, to enable the N counters based on a comparison of the ramp signal with the first analog signal level and, during a second cycle of the ramp signal, to enable the N counters based on a comparison of the ramp signal with the second analog signal level.

Advantageously, the N clock signals are offset in phase equally from one another, although non-equal phase offsets are possible.

The input for receiving at least one clock signal can be arranged to receive N clock signals which are offset in phase from one another. Alternatively, the analog-to-digital converter, or a group of analog-to-digital converters, can further comprise logic for generating at least one of the N clock signals from the received clock signal.

Another aspect of the invention provides an analog-to-digital conversion apparatus comprising a plurality of analog-to-digital converters.

The analog-to-digital conversion apparatus can further comprise a ramp generator for generating the ramp signal and a clock generator for generating the at least one clock signal.

Another aspect of the invention provides a pixel array comprising an array of pixels and an analog-to-digital converter or an analog-to-digital conversion apparatus. The analog-to-digital converter, or each of the plurality of analog-to-digital converters in the analog-to-digital conversion apparatus, is associated with a group of pixels of the pixel array.

Advantageously, the first analog signal level is a reset level of a pixel of the array and the second analog signal level is a signal level of the pixel of the array following exposure.

Another aspect of the invention provides a method of analog-to-digital conversion for generating an output digital value equivalent to the difference between a first analog signal level and a second analog signal level comprising:

receiving the first analog signal level and the second analog signal level;

receiving a ramp signal;

applying N clock signals which are offset in phase from one another to a set of N counters, where N≥2;

enabling the set of N counters based on a comparison of the ramp signal with the first analog signal level and the second analog signal level;

outputting the digital value which is a function of values accumulated by the N counters during a period when they are enabled.

The pixel array and/or the analog-to-digital converter can be manufactured using a technology such as Complementary Metal Oxide Semiconductor (CMOS).

Advantageous features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

DETAILED DESCRIPTION OF PREFERRED EMBODIMENTS

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

Throughout this specification, it should be noted that the term "row" and "column" can be interchanged. Also, the term "row" does not imply a particular orientation of the array.

Figure 1A:
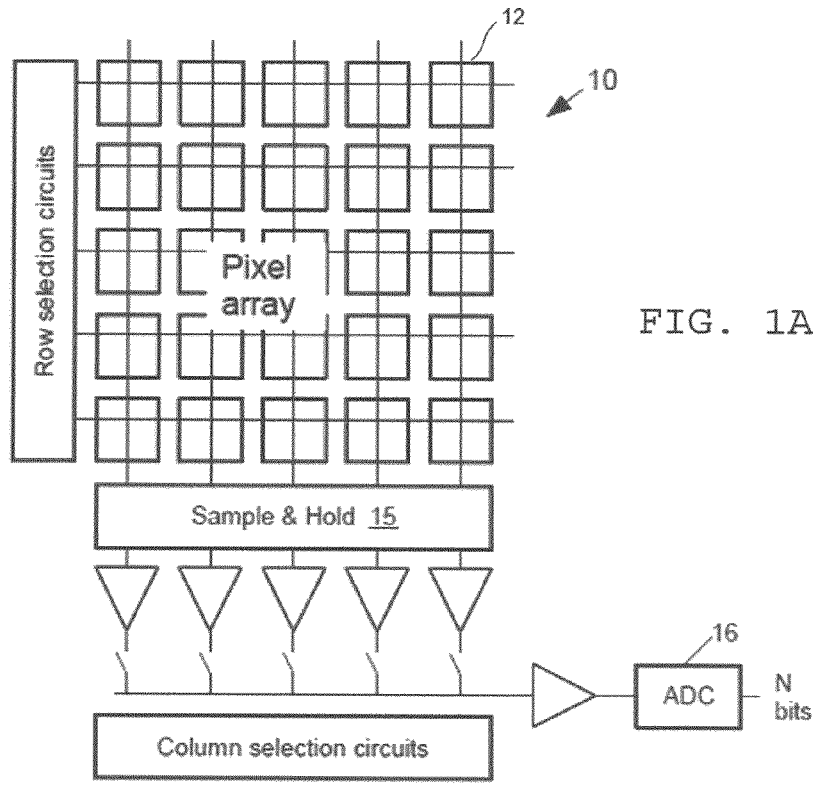
FIG. 1A shows a known architecture of an imaging sensor comprising a pixel array, a column circuit for each column of the pixel array and a single output ADC.
Figure 1B:
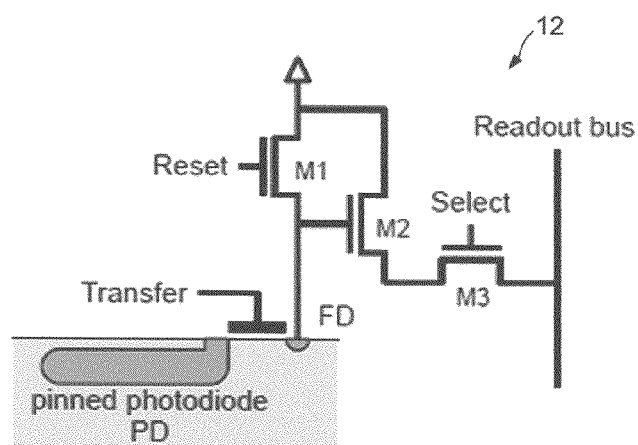
FIG. 1B shows a four transistor (4T) active pixel sensor for use in the array of FIG. 1A.
Figure 2:
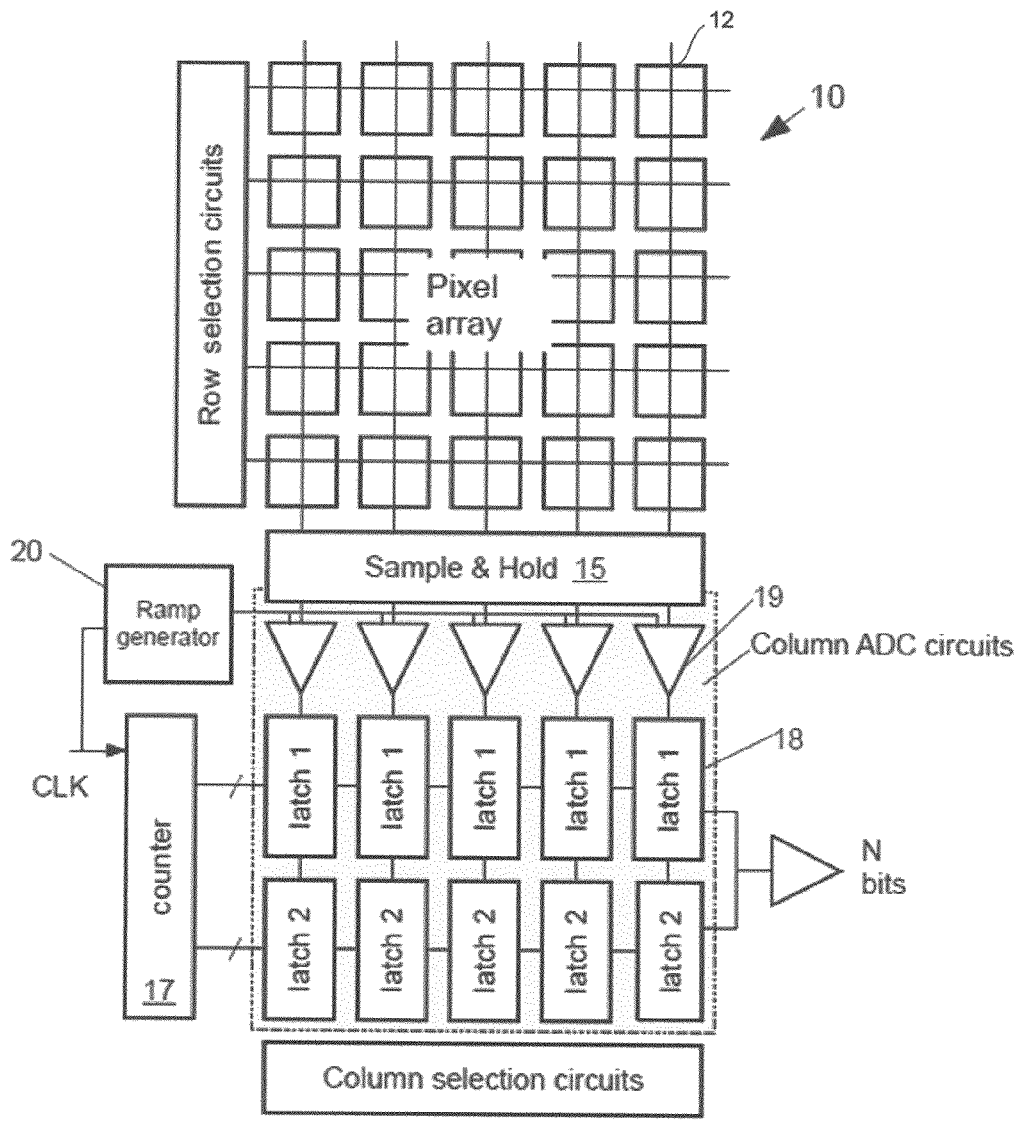
FIG. 2 shows a known architecture of an imaging sensor comprising a pixel array and a column circuit for each column of the pixel array, where analog-to-digital conversion is performed in each column circuit using a ramp signal and a counter which are distributed to each column circuit.
Figure 3:
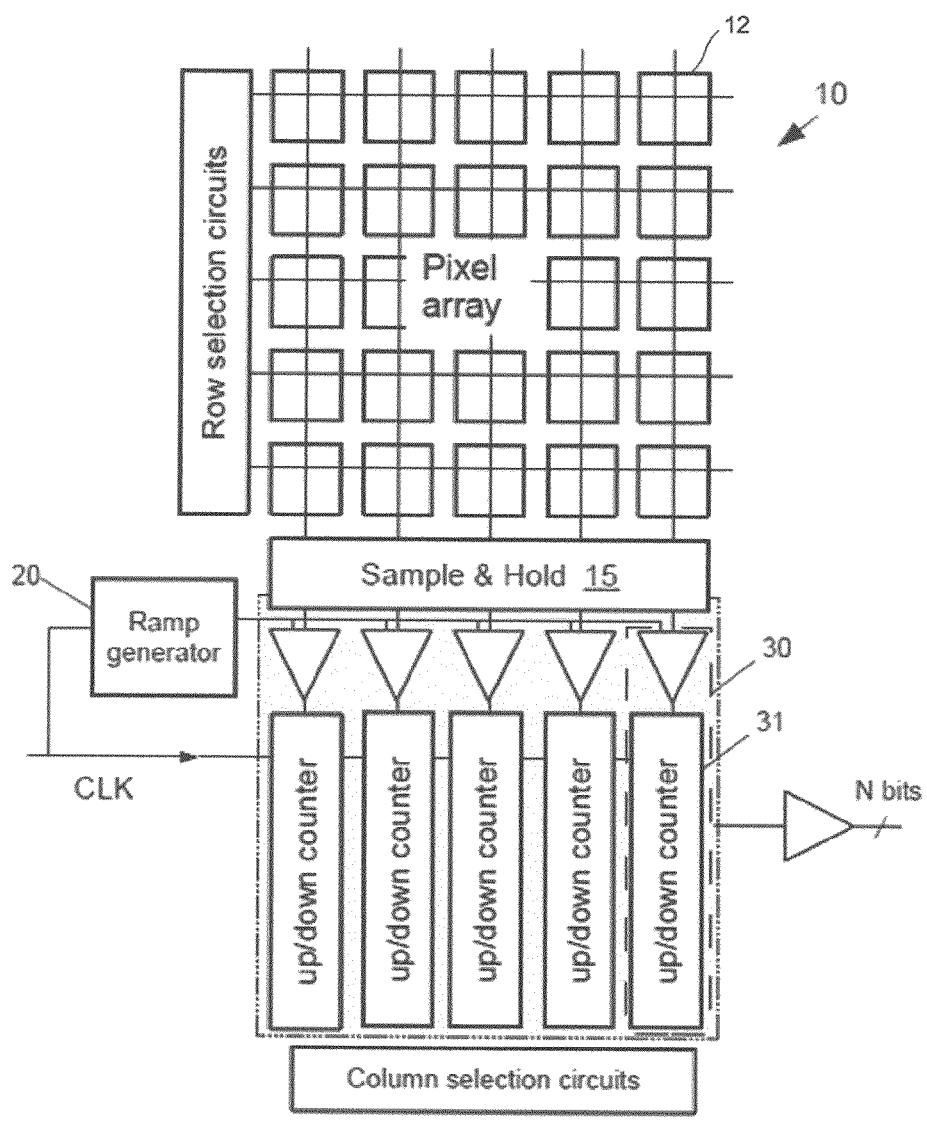
FIG. 3 shows a known architecture of an imaging sensor comprising a pixel array and a column circuit for each column of the pixel array, where analog-to-digital conversion is performed in each column circuit using a ramp signal which is distributed to each column circuit and a bi-directional counter within each column circuit.
Figure 4:
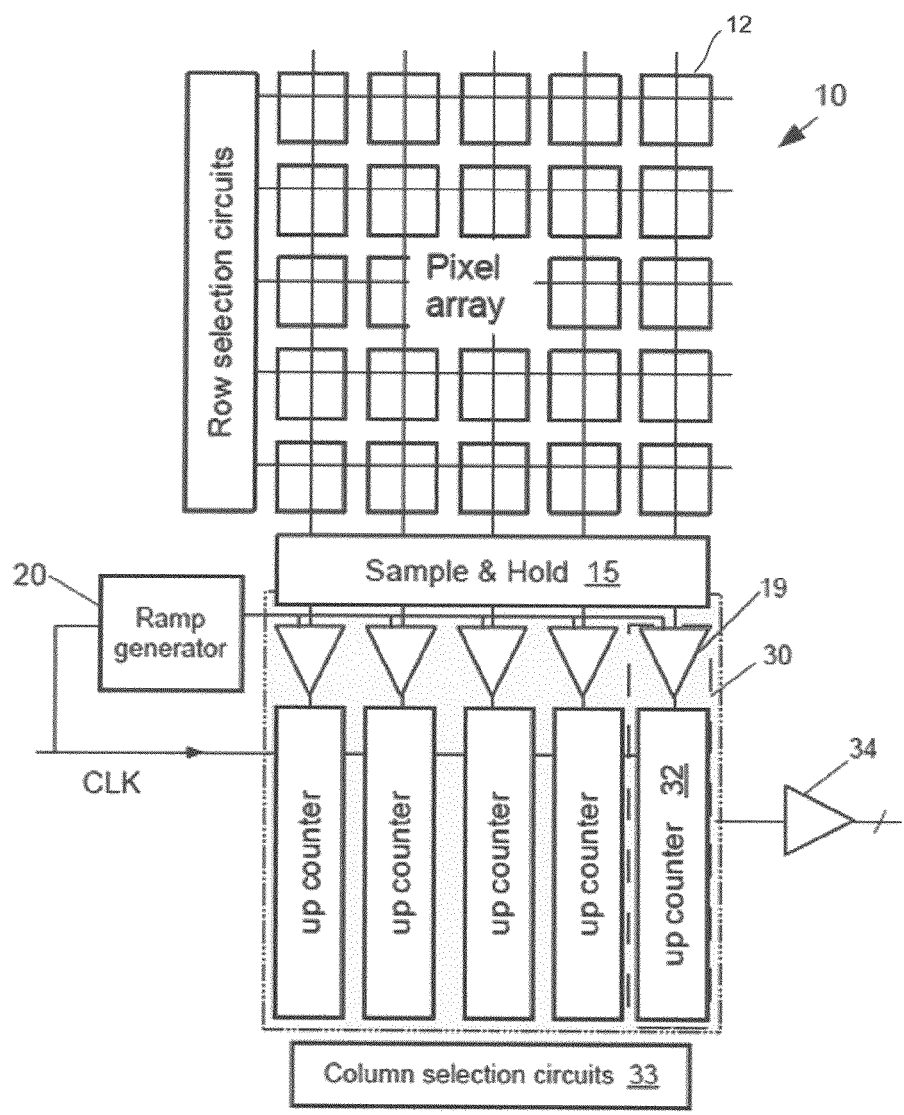
FIG. 4 shows an alternative known architecture of an image sensor comprising a pixel array and a column circuit for each column of the pixel array, where the analog-to-digital conversion is performed in each column circuit using a ramp signal which is distributed to each column circuit and a uni-directional counter within each column circuit.
Figure 5:
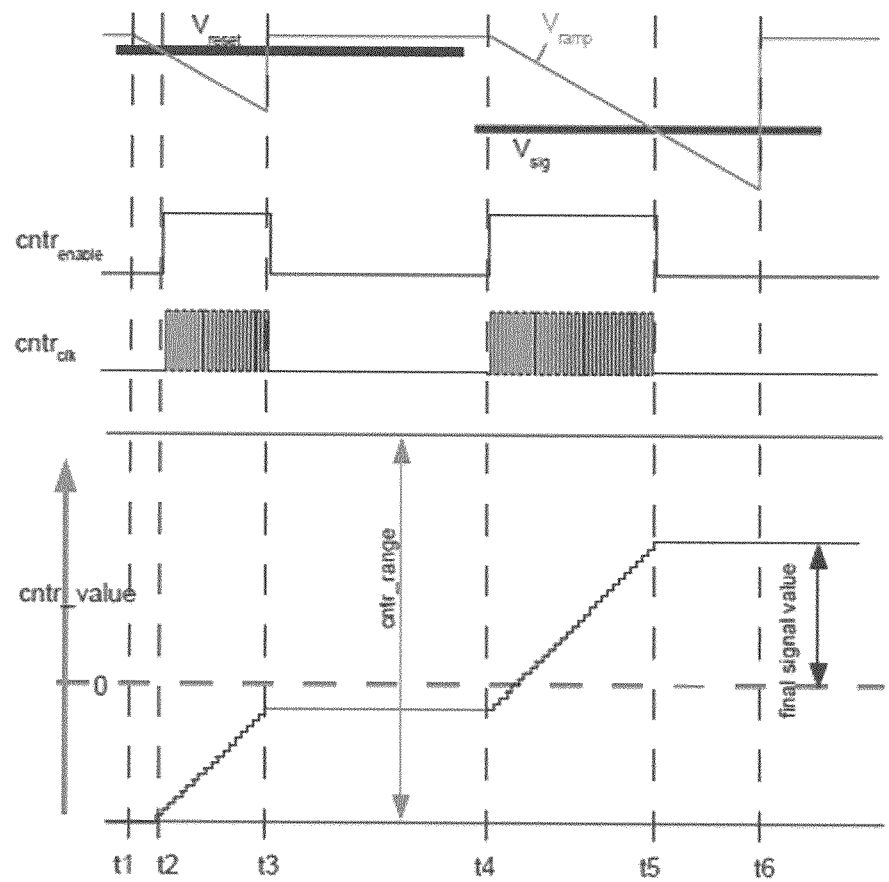
FIG. 5 shows a known operation of a particular embodiment of the column circuit of FIG. 4 to derive a digital value corresponding to a difference between two analog signal values.
Figure 6A:
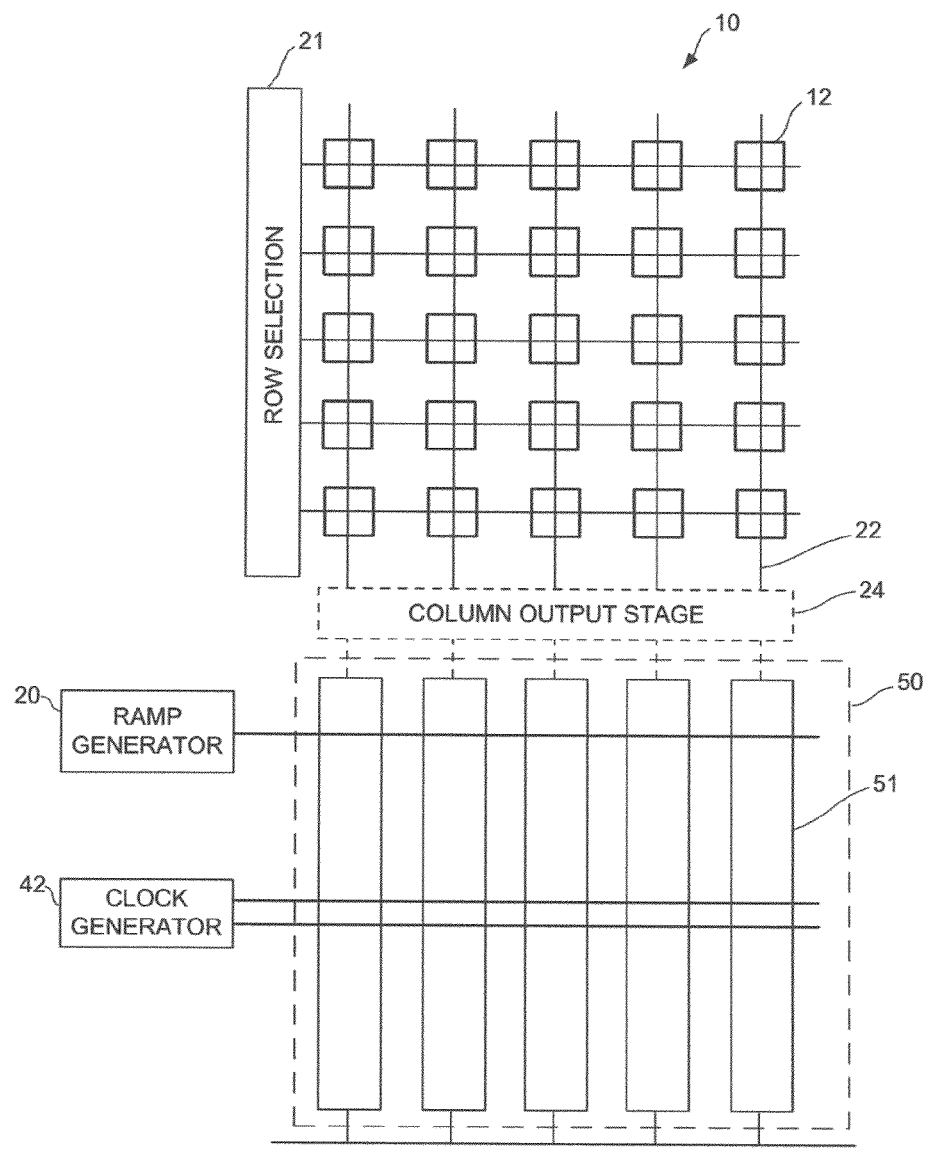
FIG. 6A shows a pixel array and analog-to-digital conversion apparatus for the pixel array.

FIG. 6A shows a pixel array 10 comprising a plurality of pixels 12. The pixels can be arranged in a rectangular array of rows and columns of square/rectangular pixels, as shown in FIG. 6A. Alternatively, the pixels can be arranged in any other suitable pattern.

Analog-to-digital conversion apparatus 50 is provided for analog-to-digital conversion of outputs of the pixel array 10. A group of pixels, such as a column of pixels, share an output bus 22. An analog-to-digital converter 51 is provided for each column of the pixel array 10. The set of analog-to-digital converters 51 can be operated in parallel with one another, thereby increasing the speed at which data can be read from the pixel array 10. For ease of explanation, embodiments will be described in terms of a column of pixels sharing a column output bus 22 and an analog-to-digital converter 51 per column. As described above, an analog-to-digital converter 51 can be provided for any other group of pixels, such as a row of pixels or a diagonal group of pixels. Another possible configuration is the use of two analog-to-digital converters per pixel column pitch. This allows to read out two rows of the pixel array in parallel. Another possibility is the use of one analog-to-digital converter per two columns and convert the pixels of a row in two successive steps, first converting the pixels on odd columns and then the pixels on even columns Each of the analog-to-digital converters 51 receives two analog signals from the column output bus 22. The two signals are a reset voltage, Vres, and a signal voltage, Vsig. The reset voltage is a voltage of a pixel following reset. The signal voltage is a voltage of a pixel following exposure to light during an exposure period. Each of the analog-to-digital converters 51 converts a difference between the two analog signals, Vres and Vsig, to a digital value. A row selection circuit 21 controls which row of pixels of the pixel array 10 is read out. For example, rows can be selected one at a time, on a rotating basis. When a row is selected, a reset level and a signal level can be read from each pixel of the selected row, and output on column output bus 22. The values read from the pixel can be stored in a column output stage 24, such as a sample-and-hold stage. Various options for the column output stage 24 are described in more detail later.

A ramp generator 20 generates a ramp signal which is distributed to the analog-to-digital converters 51. A clock generator 42 generates at least one clock signal which is distributed to the analog-to-digital converters 51. There can be multiple clock signals which are offset in phase from one another. Each analog-to-digital converter 51 uses the ramp signal and the clock signal to perform analog-to-digital conversion.

It is possible, in any of the embodiments, to provide a clock generator 42 and/or a ramp generator 20 more locally to each analog-to-digital converter 51 in the manner described in U.S. Pat. No. 8,040,269. For example, there can be a clock generator 42 and/or a ramp generator 20 per analog-to-digital converter 51, or a clock generator 42 and/or a ramp generator 20 per sub-set of the overall set 50 of analog-to-digital converter 52.

Figure 6B:
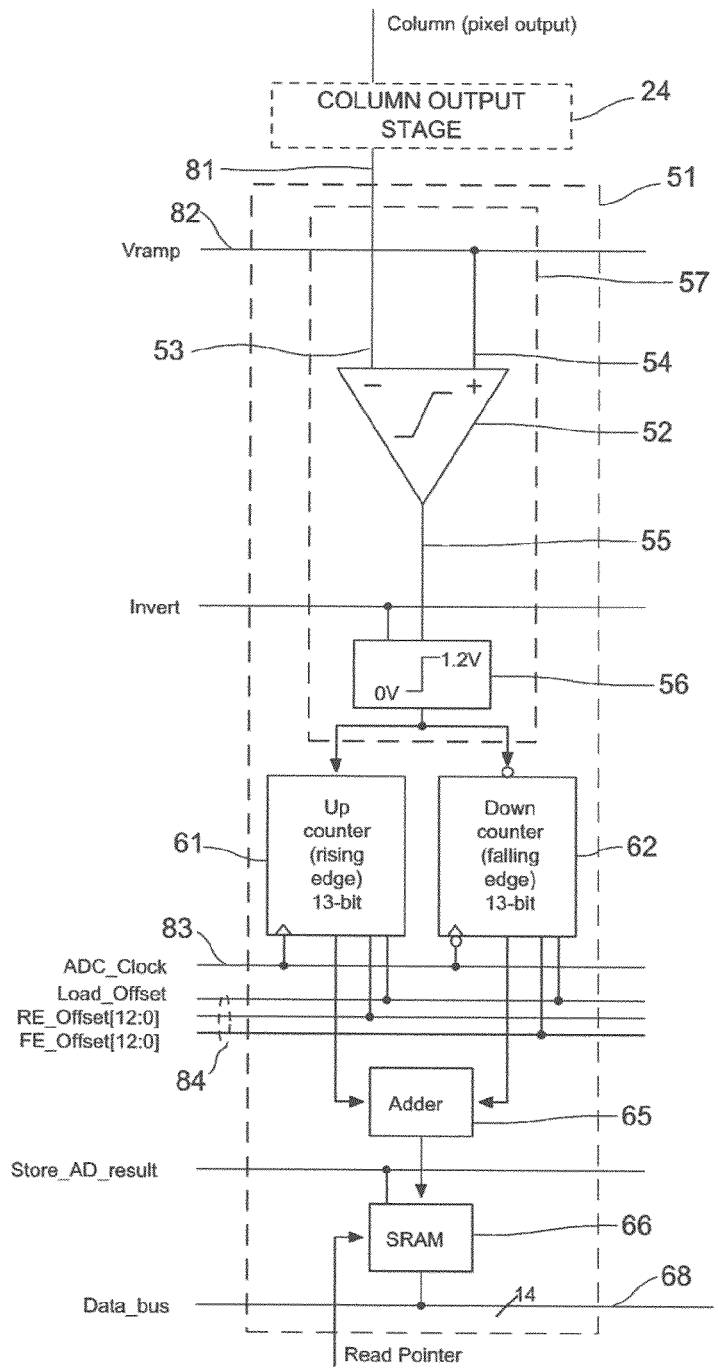
FIG. 6B shows the architecture of one of the column analog-to-digital converters.

FIG. 6B shows an embodiment of an analog-to-digital converter 51 that can be used to perform analog-to-digital conversion of signals on a column output of a pixel array 10. The analog-to-digital converter 51 comprises at least one input 81 for receiving the first analog signal level and the second analog signal level, an input 82 for receiving a ramp signal and an input 83 for receiving at least one clock signal. The circuit 51 comprises two counters 61, 62. A control stage selectively enables the counters 61, 62. The control stage comprises a comparator 52 that compares an input signal on one comparator input 53 to a ramp signal Vramp on a second comparator input 54. The input 53 can be connected to the pixel array output line 22 of a pixel array 10 of an image sensor. It can also be connected to the output of a pre-amplifier or sample-and-hold stage 24 coupled between the pixel output line 22 and the column analog-to-digital converter 51. The output 55 of the comparator 52 controls the enable/disable of the two counters 61, 62. In this embodiment, only one of the counters 61, 62 is enabled at any point in time during a conversion cycle. A logic circuit 56 is coupled between the output 55 of the comparator and the two counters 61, 62.

The circuit controls which one of the counters is counting depending on the conversion cycle used and the decision of the comparator 52 at every clock edge. Logic circuit 56 either buffers or inverts the comparator output depending on the status of the control line "invert". The circuit 56 can also contain a logic voltage level shifter. Typically the comparator and other analog circuits run on 3.3V voltage domains and the counters run on lower voltage to preserve power and increase speed, and to allow the use of smaller transistors. The value "1.2V" shown in FIG. 6B is a non-limiting example of a possible operating voltage.

A clock signal, ADC_Clock, is applied to the counters 61, 62.

Figure 6C:
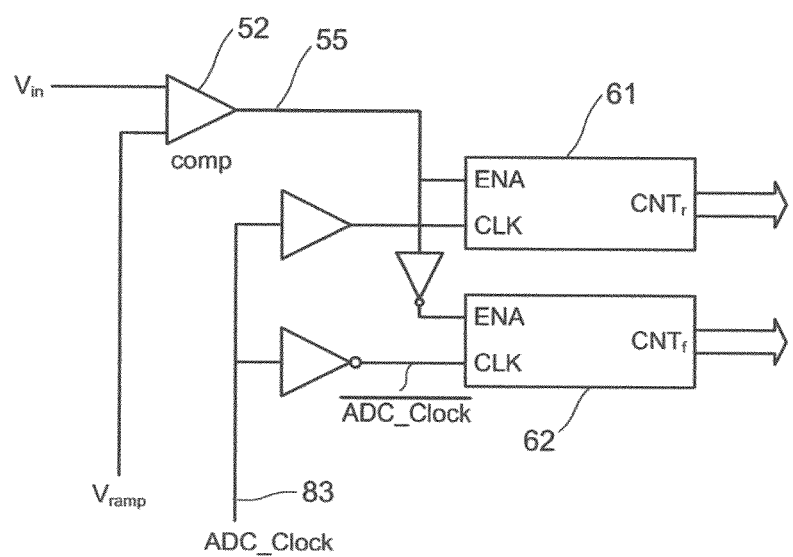
FIG. 6C shows more detail of the logic.

In this embodiment, the two counters operate at opposite clock phases of each other. Counter 61 operates on a rising edge of the clock signal and counter 62 operates on a falling edge of the clock signal. Providing one counter which operates on the rising edge of the clock signal and another counter which operates on the falling edge of the clock signal is functionally equivalent to, and can be implemented by, having two clock signals which are offset in phase by 180 degrees. Detail of the implementation is shown in FIG. 6C. The falling edge operation of counter 62 can be implemented by inverting the clock signal, ADC_Clock, at the input to counter 62, to create a second, inverted, version of the clock signal, ADC_Clock. Counter 62 can then operate on the rising edge of the inverted version of the clock signal.

Each of the counters 61, 62 accumulates a count of rising edges (falling edges) during a period in which it is enabled and outputs a digital value equal to this count. Outputs of the counters 61, 62 are applied to an output stage. In this embodiment, the output stage comprises an adder 65. An output of the adder 65 can be selectively output to storage (e.g. Static Random Access Memory, SRAM, 66) under control of a control signal Store_AD_result. An output of the storage 66 can be selectively output to a data bus, Data_bus 68, under control of a control signal, Read_Pointer. This control signal, Read Pointer, can select which value is output to the data bus.

At the start of the conversion process, before the start of the first Vramp slope, an initial offset value can be uploaded to each of the counters by the RE_Offset and FE_Offset busses and the Load_Offset control line. These are applied to a set of inputs shown collectively as 84 in FIG. 6B. Each offset value can be a negative or a positive value. The offset values uploaded to the counters and the amount of clock cycles used in the conversion process determine the end value for a black pixel (which has a signal level equal to its reset level). Offset values can be chosen so that the black level is mapped to a desired value. Alternatively an offset can be subtracted at the image sensor output, after multiplexing the data from the Data_bus 68.

Figure 7:
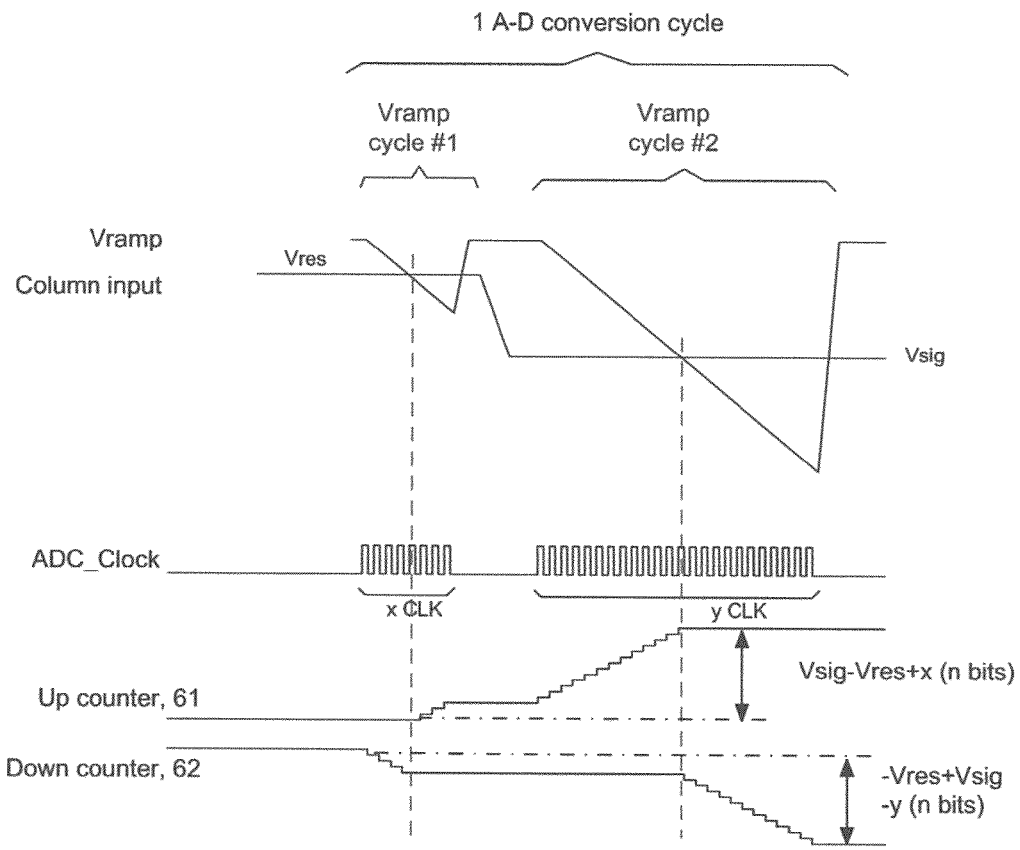
FIG. 7 shows an operation mode for the circuit of FIG. 6B.

FIG. 7 shows operation of the analog-to-digital converter of FIG. 6B. In this embodiment, one analog-to-digital conversion cycle to convert the difference between two analog signals Vres and Vsig occurs over two cycles of the ramp signal Vramp. During a first cycle of the ramp signal, Vres is compared with the ramp signal, Vramp. Counters 61, 62 are enabled based on the comparison. The first counter 61 is an up counter. It is enabled only after the ramp voltage, Vramp, crosses the reset level, Vres, and remains enabled until the end of the first cycle of the ramp signal. The second counter 62 is a down counter. It is enabled from the start of the ramp signal, Vramp, until the ramp voltage, Vramp, crosses the reset level, Vres. During a second cycle of the ramp signal, Vsig is compared with the ramp signal, Vramp. Counters 61, 62 are enabled based on the comparison. The first counter is enabled from the start of the ramp signal, Vramp, until Vramp crosses Vsig. The second counter 62 is enabled after the ramp voltage, Vramp, crosses Vsig, and remains enabled until the end of the ramp signal. After the conversion cycle, both counters 61, 62, contain a value for the difference between the signal and reset level. At the end of the conversion cycle, when the ramp voltage has reached its end value, the clock is stopped, which also stops the counters. The values of the two counters are summed together. It can be seen that only one counters 61, 62, is enabled at any point in time during the conversion cycle. At the start of the ramp cycle, one counter is enabled and the other counter is disabled. When the ramp signal crosses the input signal, the operation status of the two counters is reversed: the counter that was disabled before is now enabled, and vice versa. In FIGS. 6 and 7, both counters are unidirectional counters. One of the counters is an up-counting counter and the other counter is a down-counting counter. The role of the "invert" line is to toggle the enabling of the counters 61, 62 during the first and second Vramp cycles as shown, for example, in FIGS. 7 and 8. The "Invert" line can be low during reset conversion and high during signal conversion to change the period during which the counters are enabled between the two Vramp cycles as shown in FIG. 7. It can enable counter2 between start of ramp and comparator toggling in the first Vramp cycle and then, with the opposite level, on the "invert" line, it will enable counter 2 between the comparator toggling and end of ramp for the second Vramp cycle.

Figure 8:
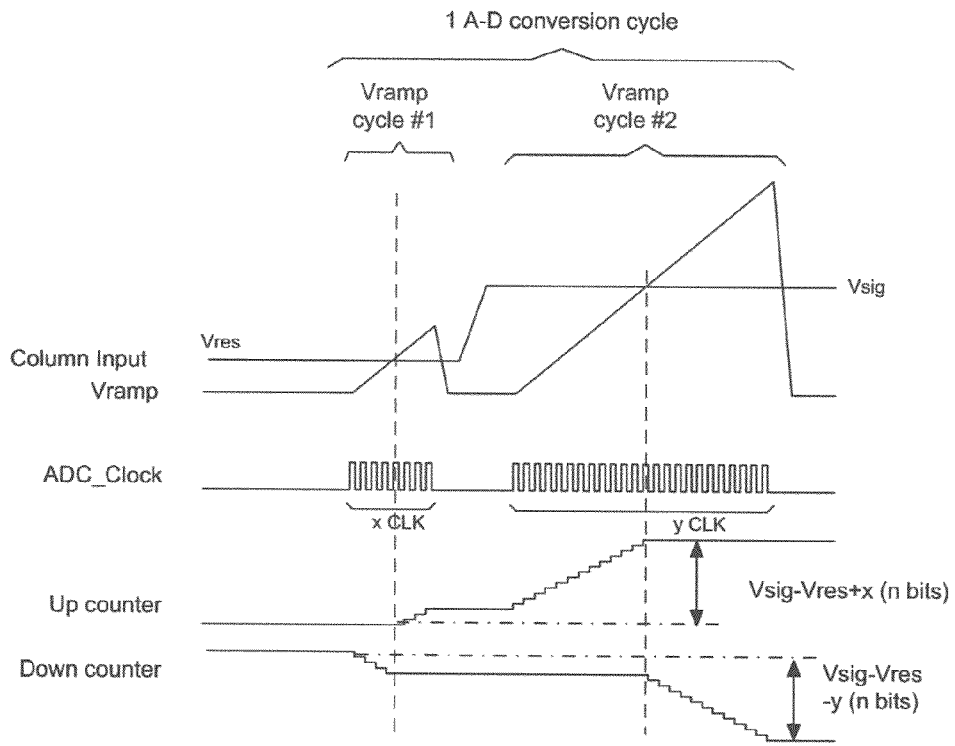
FIG. 8 shows another operation mode for the circuit of FIG. 6B.

In FIG. 7 the conversion cycle is shown with a Vramp signal that decreases in value over each ramp cycle. FIG. 8 shows the same signals, but now with a Vramp signal that increases in value over each ramp cycle. Whichever of the implementations is used depends on the DC voltage level of the reset level.

Figure 9A:
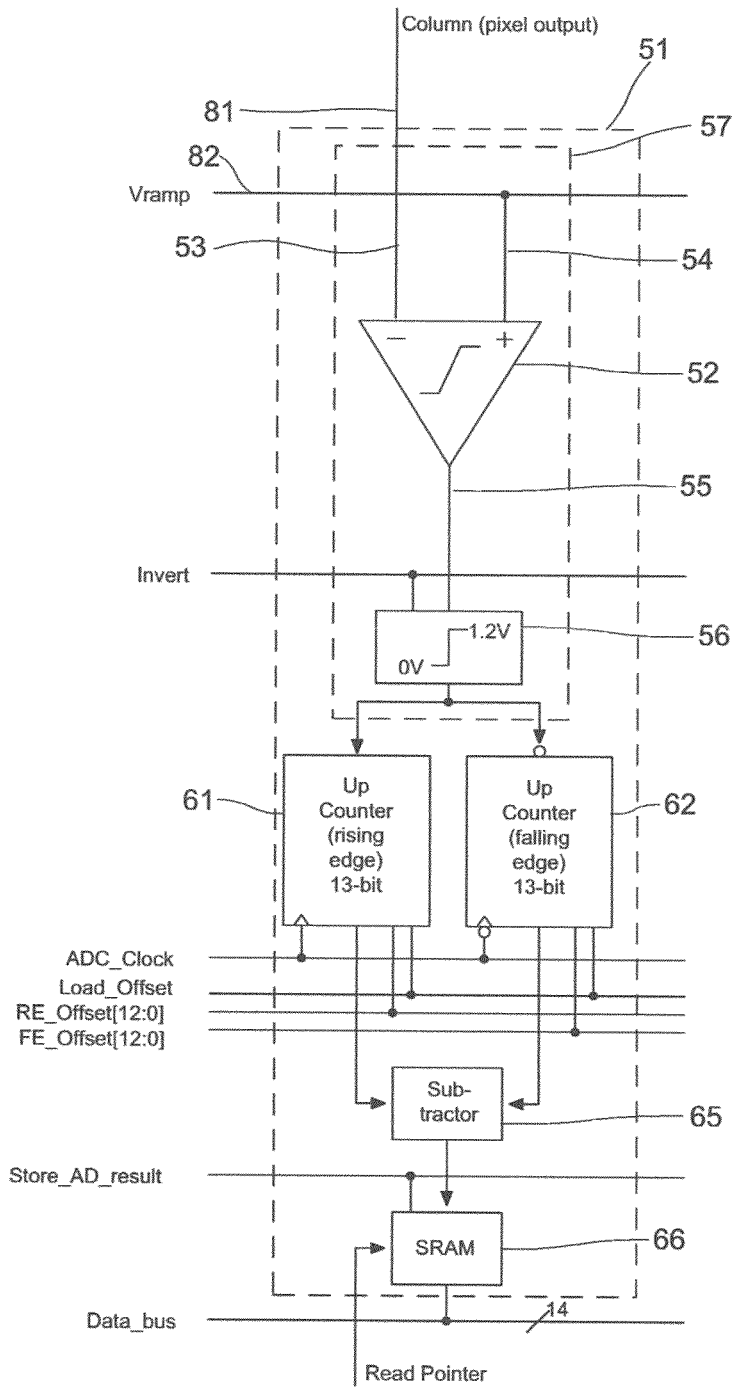
FIG. 9A shows an architecture of a column analog-to-digital converter using two up-counters and a subtraction circuit.
Figure 9B:
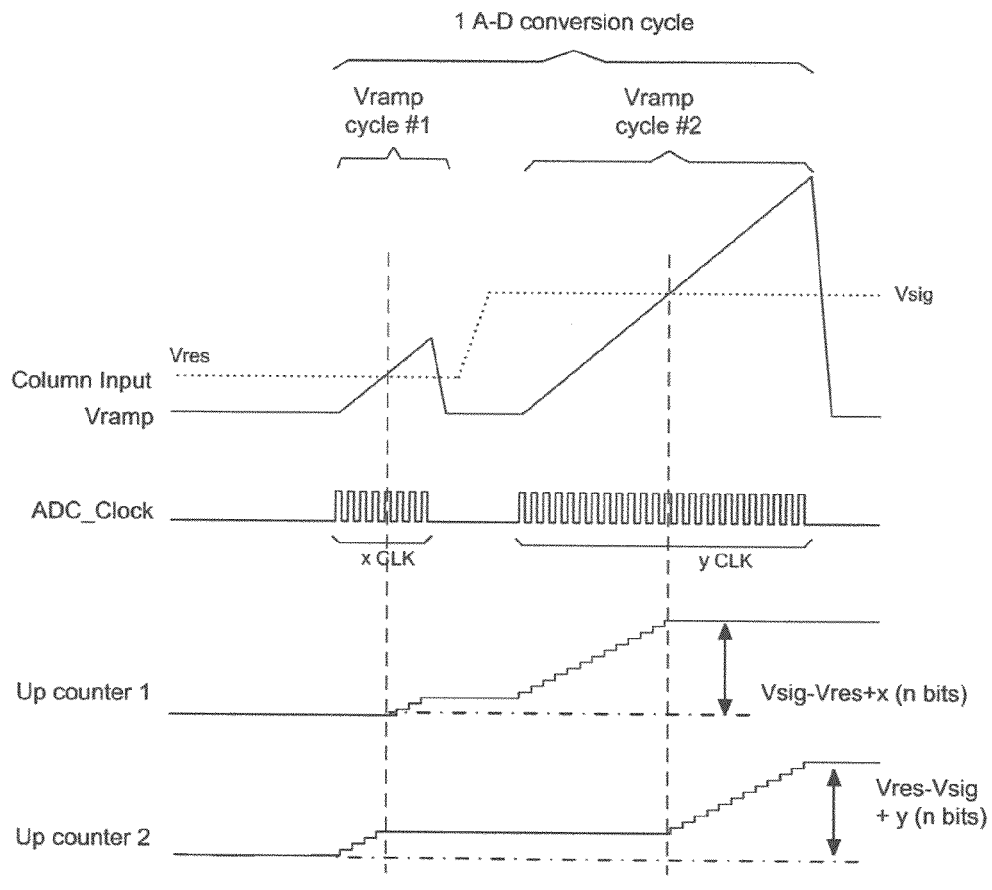
FIG. 9B shows an operation mode for the circuit of FIG. 9A.

In FIGS. 7 and 8 one of the counters is an up counter and the other counter is a down counter. Alternatively, both counters 61, 62 can be uni-directional up counters, and the value of both counters is subtracted at the end of the conversion cycle. This is shown in FIGS. 9A and 9B.

As described above, it is advantageous that the two counters 61, 62, in the column analog-to-digital converter 51 operate on two clock signals which are offset in phase from one another. The two signals can be offset in phase by 180 degrees. This increases the resolution of the analog-to-digital conversion by one bit compared to a case where both counters operate on the same clock signal.

Figure 10:
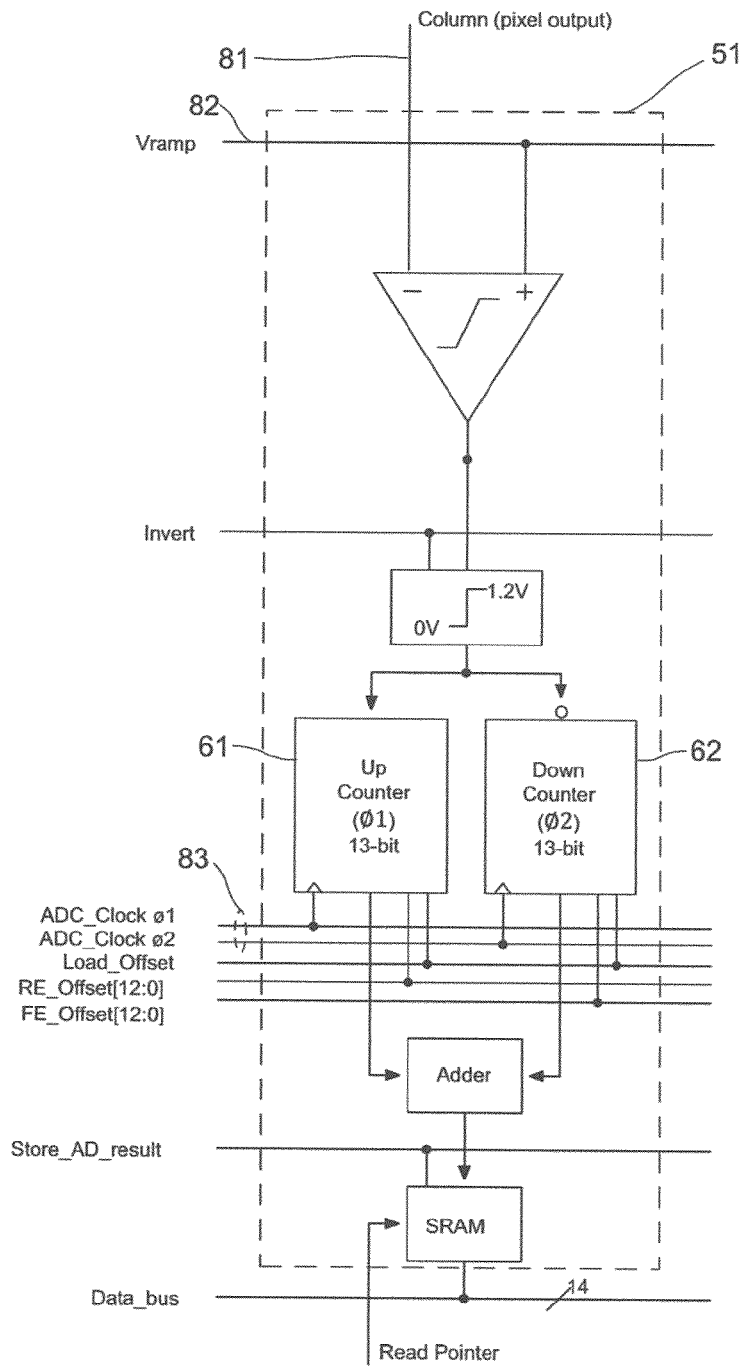
FIG. 10 shows an architecture of a column analog-to-digital converter with two clock signals distributed to the circuit.

In the embodiments described up to now, a single clock signal is distributed to the column analog-to-digital converter 51 and the clock signal is inverted to form the second, phase offset, clock signal. This is advantageous as the number of lines required to distribute signals to the circuits 51 is minimised. Alternatively, two clock signals can be distributed to the circuits 51. This is shown in FIG. 10. A first clock signal, ADC_Clock Ø1, is coupled to an input of counter 61. A second clock signal, ADC_Clock Ø2, is coupled to an input of counter 62.

Figure 11A:
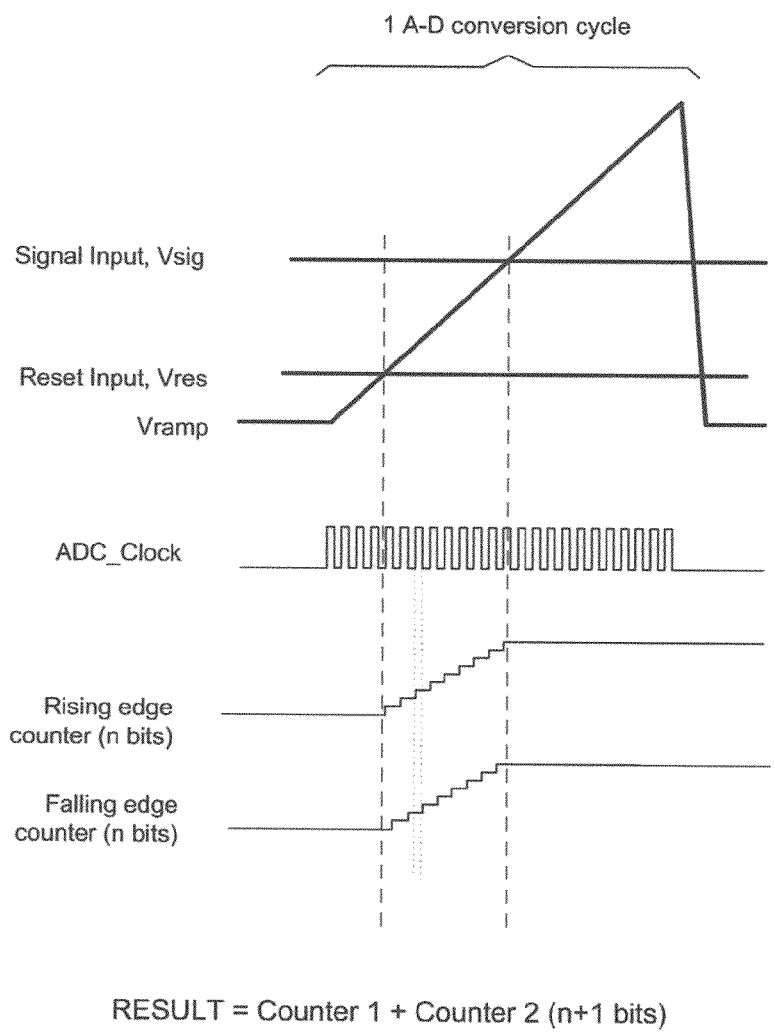
FIG. 11A shows an operation mode with a single conversion cycle, which can be applied to the circuit of FIG. 6B.
Figure 11B:
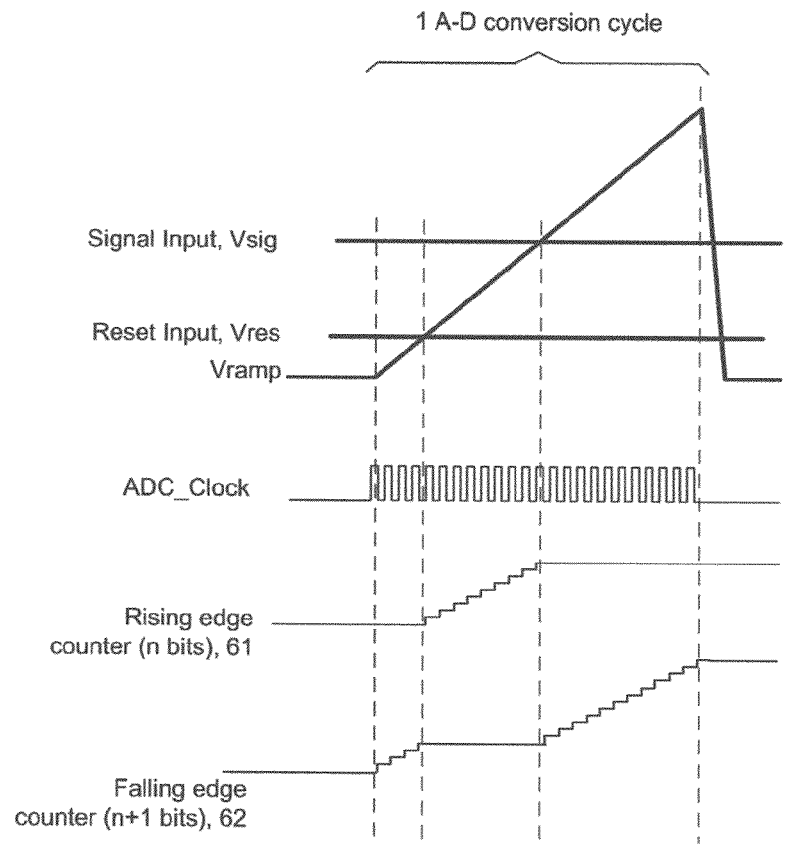
FIG. 11B shows operation modes with a single conversion cycle.

Operation of embodiments described above shows an analog-to-digital conversion cycle with two cycles of a ramp signal, Vramp. FIGS. 11A and 11B show embodiments of an analog-to-digital conversion cycle with one cycle of a ramp signal, Vramp. As in the previously described embodiments, a control stage compares the analog signals Vres and Vsig with a ramp signal, Vramp, and selectively enables counters 61, 62.

In FIG. 11A, the two counters are enabled together. The two counters are enabled when the reset input, Vres, equals the ramp signal, Vramp. The two counters are stopped when the signal input, Vsig, equals the ramp signal, Vramp.

In FIG. 11B, only one of counters is enabled at a time. Counter 62 is enabled at the start of the cycle of the ramp signal, and is stopped when the reset input, Vres, equals the ramp signal, Vramp. Counter 61 is then enabled. Counter 61 is stopped when the signal input, Vsig, equals the ramp signal, Vramp. Counter 62 is then enabled again, and remains enabled until the end of the cycle of the ramp signal. FIG. 11B has an advantage of a constant current consumption during the conversion cycle, for all circuits 51, irrespective of their reset and signal values.

Counter 61 counts on the rising edge of the ADC clock and counter 62 counts on the falling edge of the ADC clock. At the end of the conversion cycle, both counter values are summed. This delivers one extra bit in accuracy. If both counters are 10 bit counters, an 11 bit conversion can be realised. FIGS. 11A and 11B show a ramp signal, Vramp, which increases in amplitude over time. Alternatively, the ramp signal can decrease in amplitude over time.

In any of the embodiments, described above the bit width of the counters can include an extra overflow bit and possibly also an extra sign bit. The counters may be pre-loaded at start with a negative offset level. Alternatively a digital offset level may be subtracted during readout of the counter data or pixel data.

Figure 12:
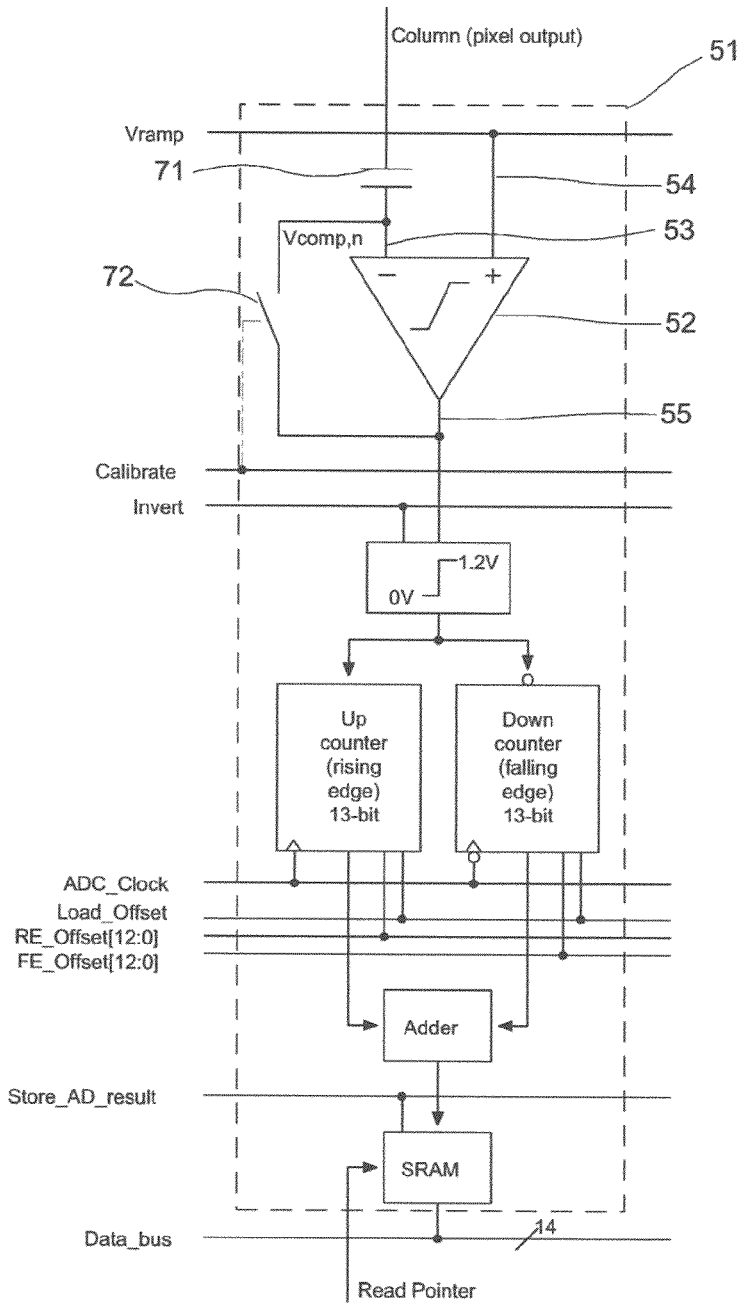
FIG. 12 shows an architecture for the analog-to-digital converter with an extra offset compensation step for the comparator.
Figure 13:
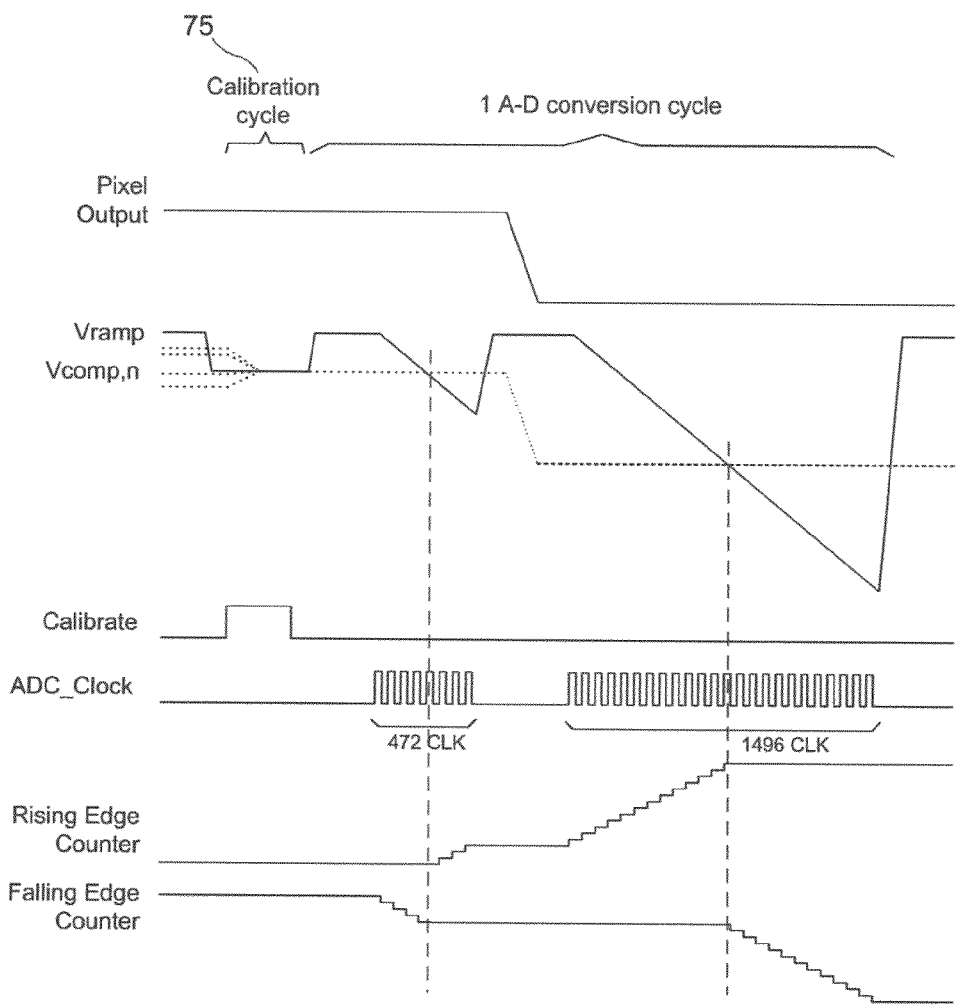
FIG. 13 shows a timing diagram for the circuit of FIG. 12.

FIG. 12 shows an offset compensation circuit for the comparator of the analog-to-digital converter. This compensation circuit can be applied to any of the analog-to-digital converters 51 shown in this document. The negative input 53 of the comparator 52 is coupled to an input from the column of the pixel array via a series capacitor 71. A feedback switch 72 is connected between the negative input 53 and the output 55 of the comparator 52. An example of the timing for this circuit is shown in FIG. 13. In a calibration cycle 75 that occurs before the first conversion cycle, the offset of the comparator 52 is sampled onto this comparator via the calibration feedback switch 72. The offset level of the input of the comparator 52 is sampled onto the series capacitor 71. After opening the calibration switch 72, the offset spread at the input of the comparator 52 is considerably reduced. The reset level can then be converted in a first ADC conversion cycle and the signal level is converted in a second conversion cycle, as previously described. The calibration of the comparator can result in a much smaller random offset variation between the comparators. Such random offset variation is cancelled by the differential operation of the ADC, but the Vramp signal used during the first conversion cycle should advantageously cover the entire range of expected offset variations. After calibration of the comparator with this offset compensation technique, this range is much smaller and the range of the Vramp signal can be considerably reduced. Also the number of clock cycles during this first cycle can be reduced. This reduces the conversion time required for the analog-to-digital converter. This calibration can be executed before every conversion cycle, or it can be executed before a burst of conversion cycles. For example, in a two-dimensional pixel array with rows and columns, and a column output bus per column of pixels, the calibration cycle can be executed before the AD conversion of the first row of the pixel array. Alternatively, the calibration cycle can be executed before the AD conversion of every row of the pixel array.

Figure 14:
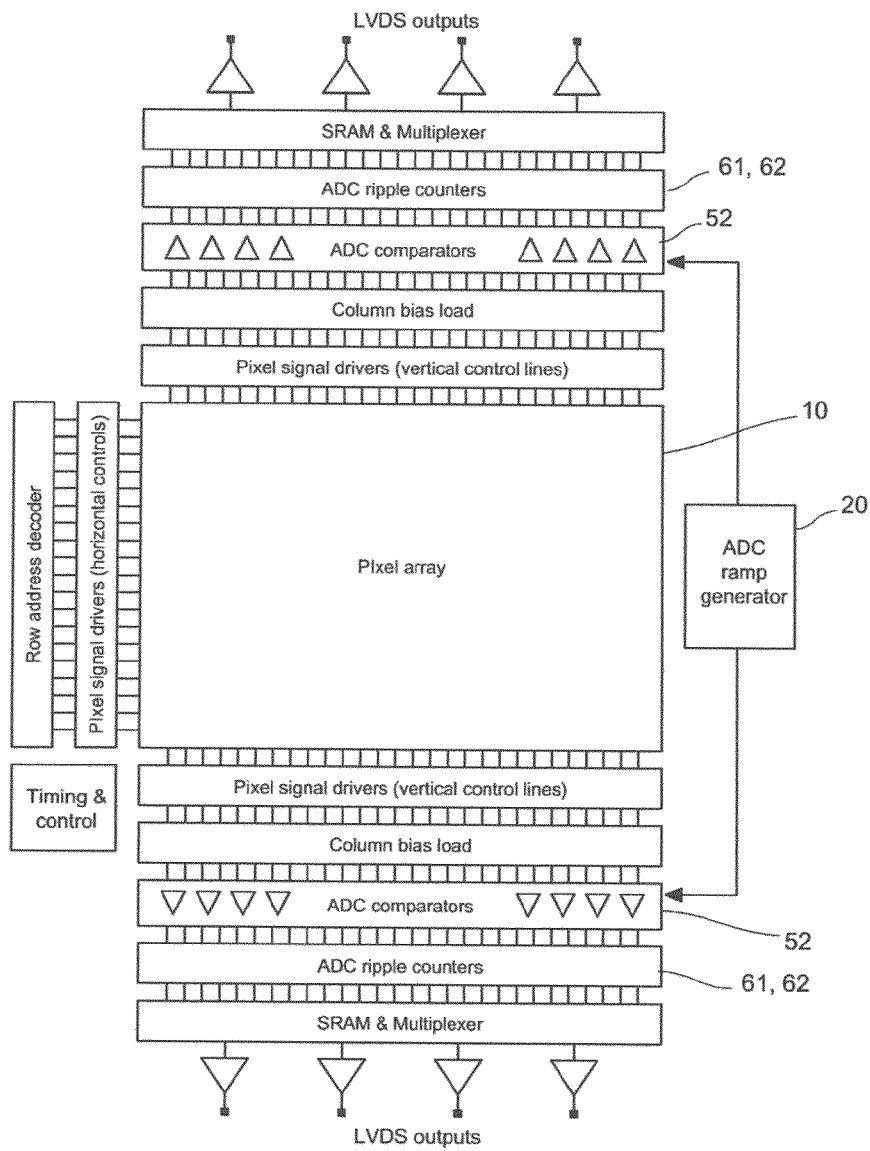
FIG. 14 shows an architecture of a CMOS image sensor using the column analog-to-digital converter.

FIG. 14 shows the architecture of an image sensor using the column AD converters. A readout is shown at both sides of the pixel array. This is done to increase the frame rate: two rows of the image can be converted in parallel: one at the top side ADCs and one at the bottom side ADCs.

Figure 15:
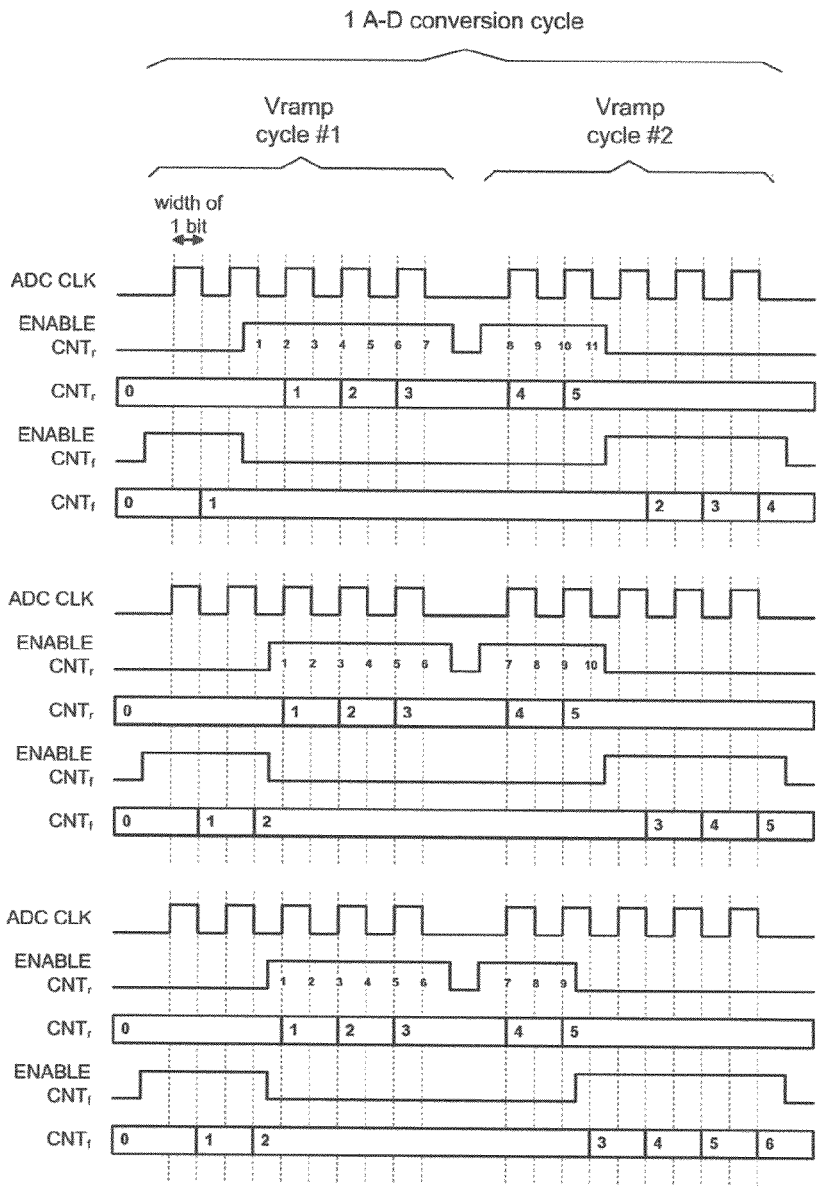
FIG. 15 shows a timing diagram to illustrate operation of an embodiment.

Although an addition or subtraction circuit 65 is shown in each analog-to-digital converter 51 the addition or subtraction can, alternatively, be performed in a digital readout block, downstream of the analog-to-digital converter 51. This requires the two counter values to be read from the analog-to-digital converter 51. FIG. 15 shows a timing diagram to illustrate the effect of counting on two opposite clock edges for the two counters, 61, 62, shown in previous embodiments and how that increases the quantisation levels of the analog signal and thus the bit resolution by one bit. Each example shows an A-D conversion cycle with two ramp cycles: one for conversion of the reset value, Vres, and one for the conversion of Vsig. Each example shows: an ADC clock; an enable signal for the rising edge counter; a rising edge counter; an enable signal for the falling edge counter; a falling edge counter. Counter count values are shown for each of the counters. This example relates to uni-directional counters 61, 62, which both count upwards. In each of the examples there are 10 clock periods, which result in 20 quantisation levels. With this timing there are thus 20 possible ADC output levels. The comparator always enables one of the two counters CTRr or CNTf.

In the first example, the signal converted during the second Vramp conversion cycle is a bit higher than during the first cycle. During the first cycle, CNTr reaches 3 counts and CNTf reaches 1 count. During the second conversion cycle, CNTRr is incremented two more times, resulting in an end value of 5 counts. CNTRf is incremented 3 times, with an end value of 4. The actual ADC value is then CNTRr+CNTRf or 11 counts.

In the second example, the same signal level is converted during both Vramp cycles. This results in an output value of 10 counts, in the middle of the range and equal to the number of clock periods used. This is, for example, the case for a black pixel. An offset can be subtracted to put this at the desired level for black.

In the third example, the signal during the first Vramp cycle is higher than during the second ramp cycle.

Figure 16A:
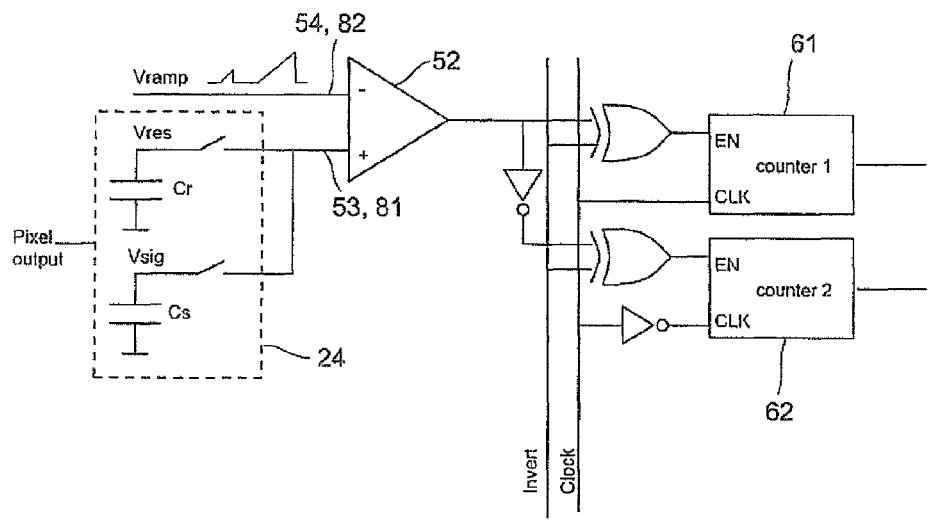
FIGS. 16A and 16B show input/control stages of a column analog-to-digital converter for serial conversion of analog input signal levels.
Figure 16B:
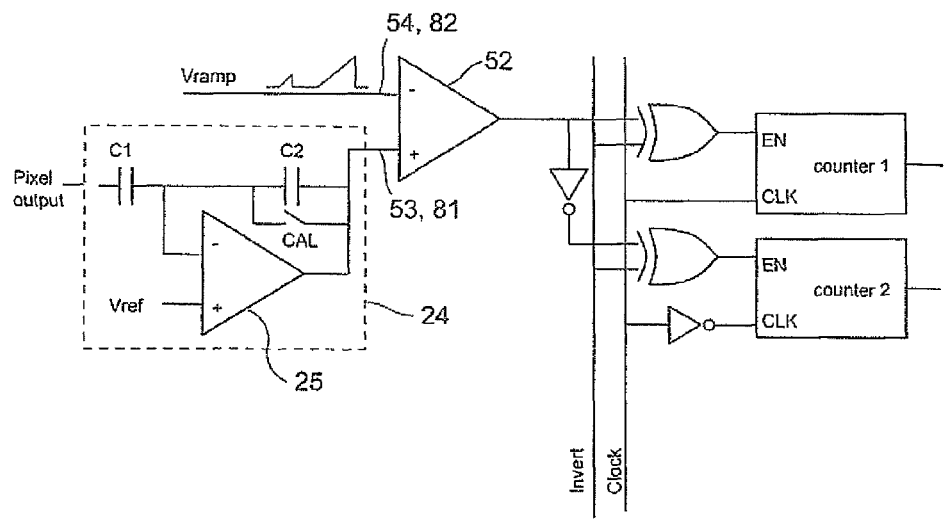
Figure 17:
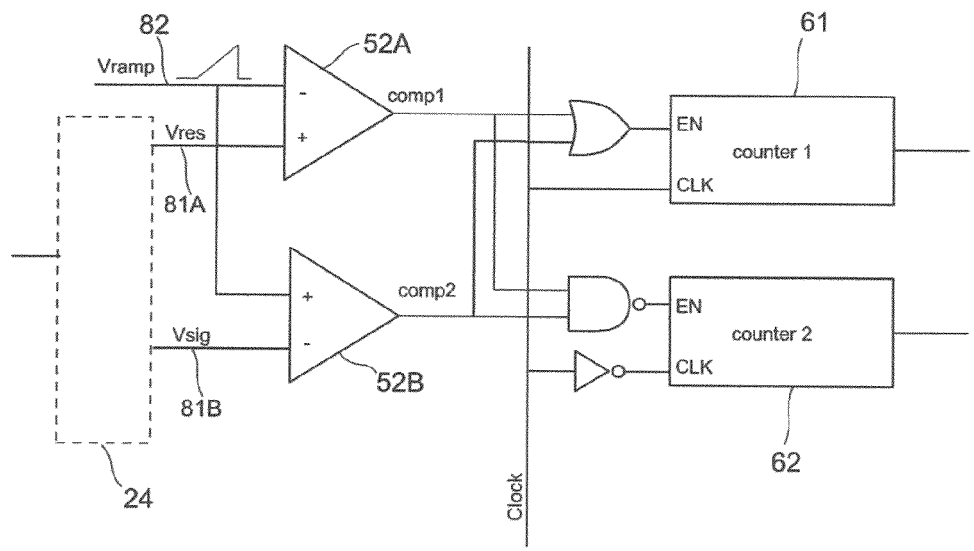
FIG. 17 shows an input/control stage of a column analog-to-digital converter for parallel conversion of analog input signal levels.
Figure 17:
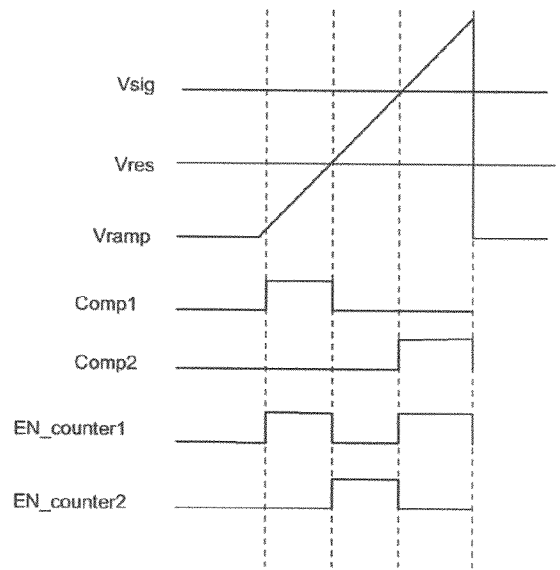

FIGS. 16A, 16B and 17 show, in more detail, some possible arrangements for the column output stage 24 and control stage 57. FIG. 16A shows a circuit in which the reset and signal levels (Vres and Vsig) are supplied sequentially to the ADC circuit 51. This can be used with the embodiments where the conversion occurs over two cycles of the ramp signal, or in an embodiment where the conversion occurs over one cycle of the ramp signal, with the reset level being compared with the ramp signal before the signal level being compared with the ramp signal. The reset and signal levels are sampled on storage capacitors Cr and Cs by a previous stage (column output stage 24) in the readout path. A switch sequentially connects Vres and Vsig to the single input 81 of the AD converter 51, and the comparator input 53. The ramp signal Vramp is applied to input 82 of the AD converter and the other comparator input 54. For the first cycle of the ramp signal (or for the first part of the single conversion cycle), Vres is connected to the comparator input 53. For the second cycle of the ramp signal (or for the second part of the single conversion cycle), Vsig is connected to the comparator input 53. The output of the comparator passes through some logic and enables the two counters 61, 62 The logic ensures that counter 2 (62) is enabled when counter 1 (61) is not enabled, and vice versa. In the two successive conversion cycles, the operation of the counters is reversed by the invert signal, which passes through an exclusive-or (EXOR) gate together with the comparator output or its inverse. The two counters operate at inverse clock edges.

FIG. 16B shows a different implementation in which the reset and signal levels (Vres and Vsig) are provided sequentially. A capacitive pre-amplifier 25 is shown that connects the pixel output to the positive comparator input 53. The negative comparator input 54 receives the Vramp signal. The amplifier 25 amplifies (Vsig−Vres) by the ratio of the capacitances C1/C2. C1 and C2 can be adjustable, if required. The amplifier 25 receives a reference voltage Vref at one input. A calibration switch CAL can be used to initialise the amplifier 25. In the first conversion cycle, the pixel reset level is applied to the pre-amplifier input. The calibration switch CAL is closed and opened again. The output of the pre-amplifier is now approximately at Vref level. The output level is:

$$Vref+Voffset+Vktc,$$

where Voffset represents the fixed input offset of the amplifier and Vktc is the kTC noise of the sampling process of Vreset on C1. This level is converted by the AD converter, by starting the first ADC conversion cycle. The output of the ADC comparator 52, and the inverse output of the comparator 52, drive counters 1 and 2 (61, 62). When this first conversion cycle is finished, the pixel signal level Vsig is applied. The amplifier 25 now outputs: (C1/C2)*(Vsig−Vres)+Vref+Voffset+Vktc. This signal is converted by the ADC in a second conversion cycle. Similar to FIG. 16A, the EXOR gate ensures that the counters are now active at opposite phases of the conversion process. Counter 2 operates again at the opposite clock edge of Counter 1.

FIG. 17 shows an example of simultaneous conversion of signal and reset levels. There are now two inputs 81A, 81B; an input 81A for the analog signal level Vres and an input 81B for the analog signal level Vsig. The control stage has different logic compared to the control stages shown previously, and comprises two comparators 52A, 52B and a different set of logic gates operating on the outputs of the comparators 52A, 52B. The control stage is arranged to simultaneously compare the two analog input signal levels Vres, Vsig, with the ramp signal. The output of the two comparators 52A, 52B is combined by logic to enable counters 1 and 2 (61, 62) according to the timing shown. Counters 61, 62 operate at opposite clock edges. This method can result in a faster conversion, since only one conversion cycle is required.

Other configurations are possible. In FIG. 17 the positive and negative inputs can be swapped and/or the logic can be modified. Where input analog signals are sequentially applied to the control stage, it is possible to directly apply the column output of the pixel array to the input of the column analog-to-digital converter 51, without a column output circuit 24 (e.g. a sample-and-hold circuit as shown in FIG. 16A) or a pre-amplifier (FIG. 16B).

All of the embodiments described so far have two counters. More generally, the number of counters can be defined as N. The number of counters can be greater than two, i.e. N≥2, such as N=3, 4, 5, . . . .

In some embodiments, all of the counters are enabled at once, during a part of the conversion cycle. An example of this is shown in FIG. 11A, where the counters are enabled for the period between the ramp signal, Vramp, crossing Vres and Vsig. This can be applied to any number of counters, N≥2.

In other embodiments, a sub-set of the counters are enabled during at least one portion of the conversion cycle, and another sub-set of the counters are enabled during at least one other portion of the conversion cycle. The set of N counters can be divided into a sub-set of M counters and a sub-set of K counters, where N=M+K. When N is an even integer, then advantageously the sub-sets can be of equal value, i.e. M=K. This has an advantage of ensuring a constant number of counters are enabled at any point during the conversion cycle, which means that the current consumption will be constant during the entire conversion cycle. The current consumption will be constant during the entire conversion cycle, irrespective of the reset and signal values.

Figure 18:
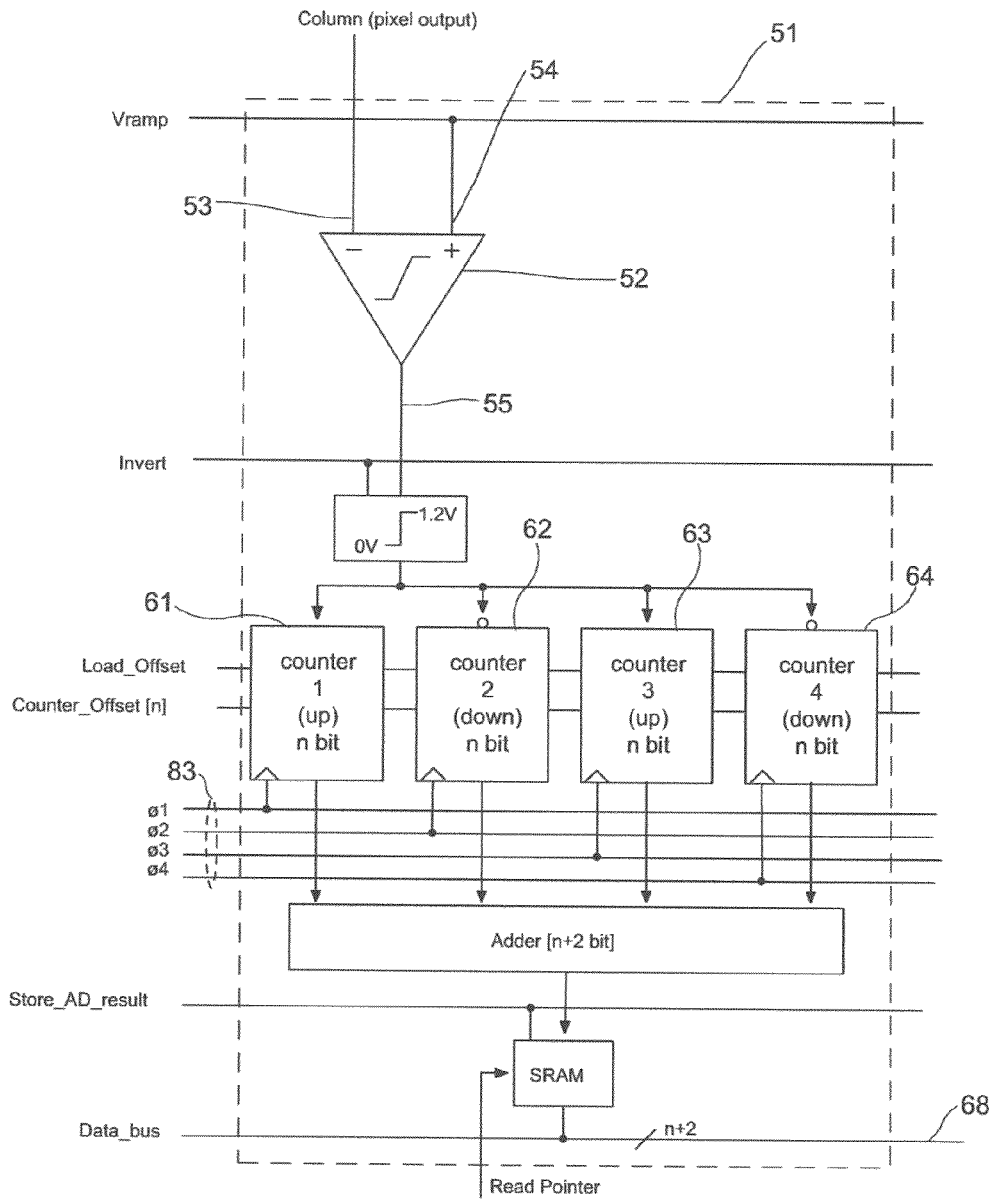
FIG. 18 shows an architecture for the analog-to-digital converter with four counters.
Figure 19:
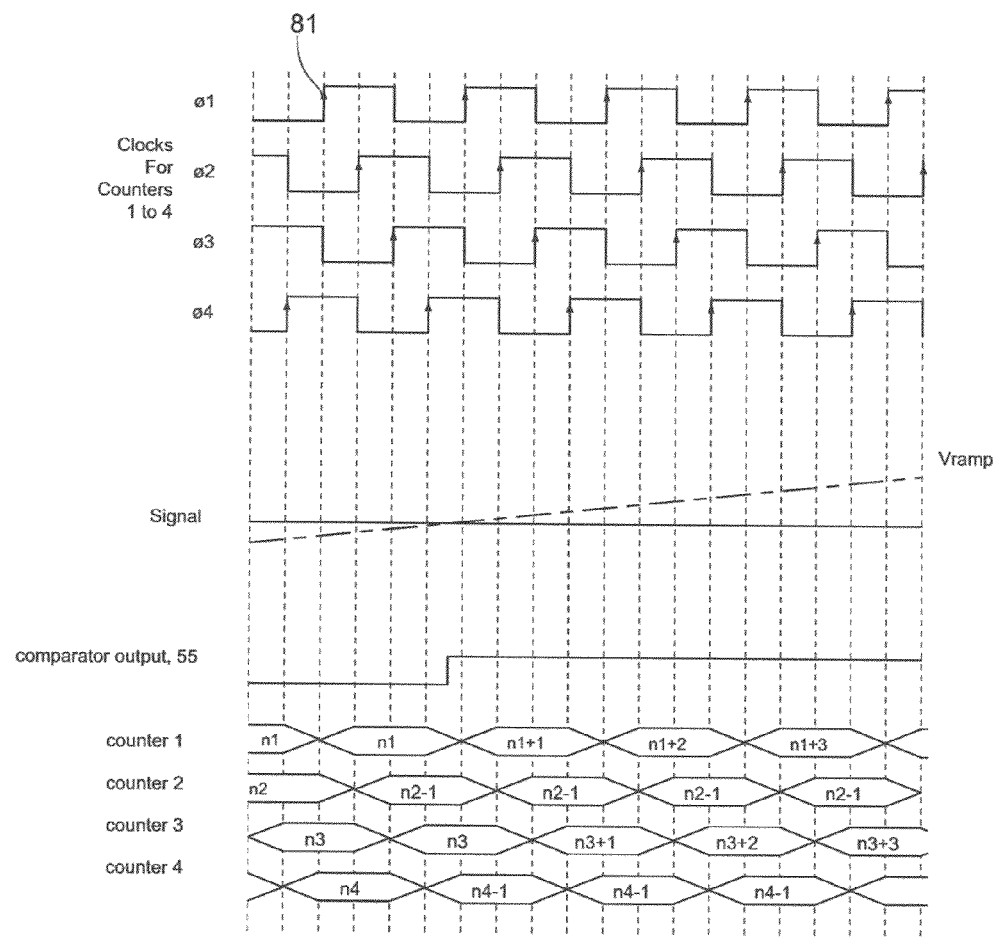
FIG. 19 shows an operation mode which can be applied to the circuit of FIG. 19.

FIG. 18 shows an analog-to-digital converter 51 with four counters 61-64. Other components are the same as described for earlier embodiments, and have the same numbers. A control stage selectively enables the counters 61-64. The control stage comprises a comparator 52 that compares an input signal on one input 53 to a ramp signal Vramp on a second input 54. The output 55 of the comparator 52 controls the enable/disable of the four counters 61-64. Four clock signals Ø1-Ø4 are received on input lines. The clock signals are offset in phase from one another. Advantageously, they are equally offset by 90 degrees from one another. A different one of the clock signal phases Ø1-Ø4 is applied to each of the counters 61-64. In FIG. 18, two of the counters (counters 61, 63) are count in an upwards direction and two of the counters (counters 62, 64) count in a downwards direction. An adder combines outputs of the counters 61-64. FIG. 19 shows operation of the circuit of FIG. 18. Each counter increments a count value when it is enabled, and when the clock signal applied to that counter has a rising edge (shown by the upwards arrows, 81 in FIG. 19). Counters 1 and 3 are enabled after crossing of the signal (Vres, Vsig) by the ramp signal, Vramp and increment a count on each rising clock edge. Counters 2 and 4 are enabled before crossing of the signal (Vres, Vsig) by the ramp signal and decrement on each rising clock edge. This is similar to FIG. 7, but with two counters enabled at a time. A final value is a sum of the four counter vales. Similar to FIG. 7, the order of enabling the counters during the first ramp cycle (Vres) and second ramp cycle (Vsig) is reversed.

Figure 20:
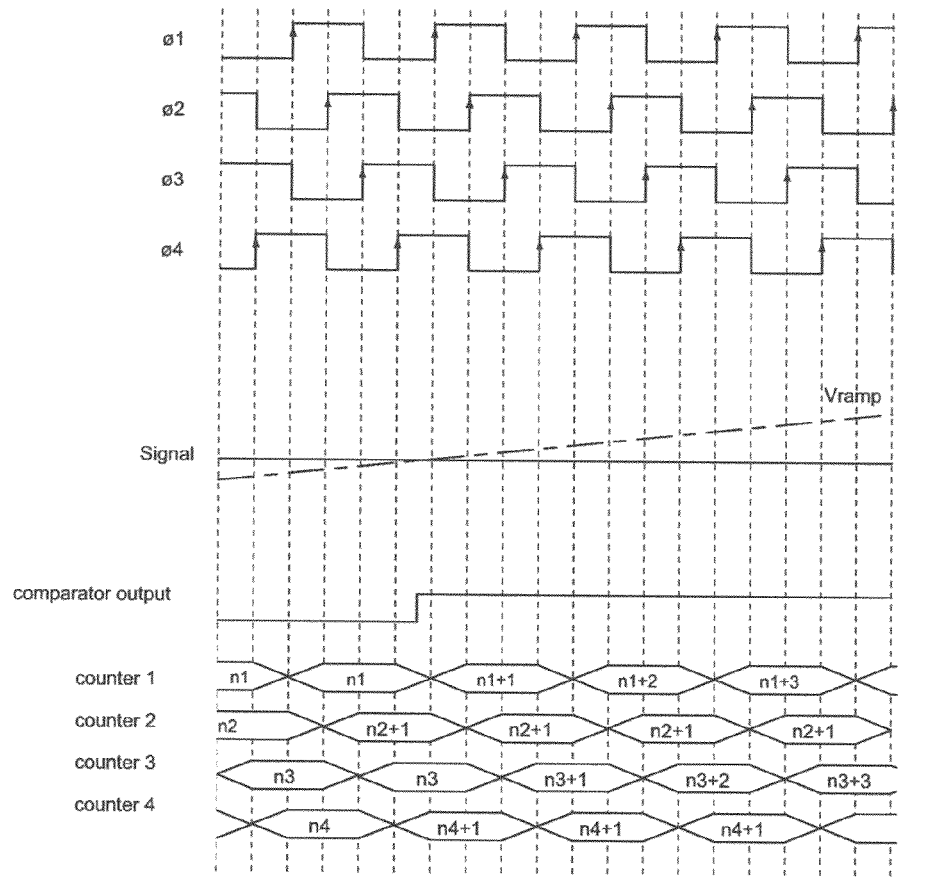
FIG. 20 shows an operation mode which can be applied to a circuit with four up counters.

FIG. 20 shows an embodiment with four counters which all operate in an upwards count direction. Operation is similar to FIG. 9B, but with two counters enabled at a time. Counters 1 and 3 are enabled after crossing of the signal (Vres, Vsig) by the ramp signal, Vramp, and increment a count on each rising clock edge. Counters 2 and 4 are enabled before crossing of the signal (Vres, Vsig) by the ramp signal and increment on each rising clock edge. A final value is:

Final value=counter 1+counter3−counter2−counter 4

Similar to FIG. 9B, the order of enabling the counters during the first ramp cycle (Vres) and second ramp cycle (Vsig) is reversed.

The clock speed for n bit conversion is divided by the number of clock phases used. Alternatively, resolution (expressed as a number of bits) is increased by the base-2 logarithm of the number of extra counters.

The arrangements shown in FIGS. 19 and 20 use an even number of counters, N=4, and a constant number of counters (2) are enabled at any time during the conversion cycle. This keeps power consumption constant.

With four counters, and four clock phases, there are four decision moments in one clock period/cycle. There is one decision made for every rising edge of one of the 4 clock phases. The maximum possible clock frequency (or shortest possible clock period) limits the speed of the conversion process. With this system having 4 clock phases it is possible to perform 4× faster conversion with than with a single counter. E.g. a 500 MHz clock has 2 ns period. If this is divided into 4 phases, it is possible to 4 clocks with 500 MHz clock frequency, but with a phase shift of 0.5 ns between each of the clock edges. This is equivalent in speed to a single counter system with a 2 GHz clock. However, a 2 GHz clock is much more difficult to generate and distribute whereas a 500 MHz clock is easier to distribute.

FIGS. 18 to 20 shows four clock signal phases distributed to the analog-to-digital converter 51. It is possible to distribute two clock phases to the analog-to-digital converter 51 and to locally form the remaining two phases by using inverters in the same way as described previously. For example, two clock signals with 90 degrees phase offset between them can be distributed. These can represent Ø1 (=0 degrees) and Ø2 (=90 degrees). The remaining signals Ø3 (=180 degrees) and Ø4 (=270 degrees) can be formed locally from Ø1 and Ø2. It is also possible to distribute a single clock signal to an analog-to-digital converter 51, or a sub-set of the analog-to-digital converters 51, and to locally form the three remaining clock phases from the single distributed clock. This requires different circuitry.

It is possible to use bidirectional counters which count in one direction (e.g. downwards) during the first ramp signal cycle, when Vres is converted, and count in the opposite direction (e.g. upwards) during the second ramp signal cycle, when Vsig is converted. The uni-directional counters in any of the embodiments described above can be substituted for bi-directional counters.

It is possible to provide a clock generator per analog-to-digital converter 51, or per sub-set of analog-to-digital converters 51. This is described in U.S. Pat. No. 8,040,269. Any of the embodiments described in this specification can be modified to provide a clock generator per analog-to-digital converter 51, or per sub-set of analog-to-digital converters 51 in the manner described in U.S. Pat. No. 8,040,269.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to an item refers to one or more of those items. The term "comprising" is used herein to mean including the method blocks or elements identified, but that such blocks or elements do not comprise an exclusive list and a method or apparatus may contain additional blocks or elements.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the invention.

The invention claimed is:

1. An analog-to-digital converter for generating an output digital value equivalent to the difference between a first analog signal level and a second analog signal level comprising:
    at least one input for receiving the first analog signal level and the second analog signal level;
    an input for receiving a ramp signal;
    an input for receiving at least one clock signal;
    a set of N counters, where N≥2, wherein the N counters are arranged to use N clock signals which are offset in phase from one another;
    a control stage which is arranged to enable the N counters based on a comparison of the ramp signal with the first analog signal level and the second analog signal level; and
    an output stage for outputting the digital value which is a function of values accumulated by the N counters during a period when they are enabled.

2. An analog-to-digital converter according to claim 1 wherein the set of N counters is divided into a first sub-set of counters and a second sub-set of counters, and wherein the control stage is arranged to enable the first sub-set of counters or the second sub-set of counters.

3. An analog-to-digital converter according to claim 2 wherein the control stage has a first output state and a second output state and wherein the control stage is arranged to enable one of the sub-sets of counters when the control stage is in the first output state and to enable the other sub-set of counters when the control stage is in the second output state.

4. An analog-to-digital converter according to claim 2 wherein the control stage is arranged to enable one of the sub-sets of counters during a first portion of a cycle of the ramp signal and to enable the other sub-set of counters during a second portion of the cycle of the ramp signal, wherein the first and second portions of the cycle of the ramp signal are contiguous in time.

5. An analog-to-digital converter according to claim 2 wherein the set of N counters is divided into a sub-set of M counters and a sub-set of K counters, where N=M+K.

6. An analog-to-digital converter according to claim 5 wherein N is an even integer value and wherein M=K.

7. An analog-to-digital converter according to claim 2 wherein the control stage is arranged to enable one of the sub-sets of counters at any point in time during a cycle of the ramp signal.

8. An analog-to-digital converter according to claim 1 which is arranged to generate an output digital value equivalent to the difference between a first analog signal level and a second analog signal level over two cycles of the ramp signal, wherein the control stage is operable:
during a first cycle of the ramp signal, to selectively enable the N counters based on a comparison of the ramp signal with the first analog signal level; and,
during a second cycle of the ramp signal, to selectively enable the N counters based on a comparison of the ramp signal with the second analog signal level.

9. An analog-to-digital converter according to claim 1 which is arranged to generate an output digital value equivalent to the difference between a first analog signal level and a second analog signal level over a single cycle of the ramp signal.

10. An analog-to-digital converter according to claim 1 wherein the N clock signals are offset in phase equally from one another.

11. An analog-to-digital converter according to claim 1 wherein the input for receiving at least one clock signal is arranged to receive N clock signals which are offset in phase from one another.

12. An analog-to-digital converter according to claim 1 further comprising logic for generating at least one of the N clock signals from the received clock signal.

13. Analog-to-digital conversion apparatus comprising a plurality of analog-to-digital converters according to claim 1.

14. Analog-to-digital conversion apparatus according to claim 13 further comprising:
a ramp generator for generating the ramp signal;
a clock generator for generating the at least one clock signal.

15. Analog-to-digital conversion apparatus according to claim 14 further comprising:
a ramp signal distribution line for distributing the ramp signal to the plurality of analog-to-digital converters;
a clock signal distribution line for distributing the clock signal to the plurality of analog-to-digital converters.

16. A pixel array comprising an array of pixels and further comprising an analog-to-digital converter according to claim 1, or an analog-to-digital conversion apparatus according to claim 13, wherein the analog-to-digital converter, or each of the plurality of analog-to-digital converters in the analog-to-digital conversion apparatus, is associated with a group of pixels of the pixel array.

17. A pixel array according to claim 16 wherein the first analog signal level is a reset level of a pixel of the array and the second analog signal level is a signal level of the pixel of the array following exposure.

18. A method of analog-to-digital conversion for generating an output digital value equivalent to the difference between a first analog signal level and a second analog signal level comprising:
receiving the first analog signal level and the second analog signal level;
receiving a ramp signal;
applying N clock signals which are offset in phase from one another to a set of N counters, where N≥2;
enabling the set of N counters based on a comparison of the ramp signal with the first analog signal level and the second analog signal level;
outputting the digital value which is a function of values accumulated by the N counters during a period when they are enabled.

19. A method according to claim 18 wherein the set of N counters is divided into a first sub-set of counters and a second sub-set of counters and wherein the step of enabling the set of N counters comprises selectively enabling the first sub-set of counters or the second sub-set of counters.

20. A method according to claim 18 wherein the set of N counters is divided into a first sub-set of M counters and a second sub-set of K counters, the method comprising:
enabling the first sub-set of M counters during a first portion of a cycle of the ramp signal based on a comparison of the ramp signal with at least the first analog signal;
enabling the second sub-set of K counters during a second portion of the cycle of the ramp signal based on a comparison of the ramp signal with at least the second analog signal,
wherein the first and second portions of the cycle of the ramp signal are contiguous in time.

* * * * *